(12) United States Patent
Tokunaga

(10) Patent No.: US 8,330,249 B2
(45) Date of Patent: Dec. 11, 2012

(54) SEMICONDUCTOR DEVICE WITH DRIVER CIRCUIT AND MEMORY ELEMENT

(75) Inventor: Hajime Tokunaga, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 199 days.

(21) Appl. No.: 12/754,928

(22) Filed: Apr. 6, 2010

(65) Prior Publication Data

US 2010/0193789 A1 Aug. 5, 2010

Related U.S. Application Data

(63) Continuation of application No. 11/905,652, filed on Oct. 3, 2007, now Pat. No. 7,714,408.

(30) Foreign Application Priority Data

Oct. 4, 2006 (JP) ................................. 2006-273394

(51) Int. Cl.
*H01L 23/52* (2006.01)
(52) U.S. Cl. .. 257/530; 257/529; 257/209; 257/E23.147
(58) Field of Classification Search .................. 257/209, 257/529, 530, E23.147
See application file for complete search history.

(56) References Cited

U.S. PATENT DOCUMENTS

| 5,206,665 A | 4/1993 | Kawade et al. |
|---|---|---|
| 5,389,475 A | 2/1995 | Yanagisawa et al. |
| 5,625,219 A | 4/1997 | Takagi |
| 5,780,919 A | 7/1998 | Chua et al. |
| 5,798,534 A | 8/1998 | Young |
| 5,929,505 A | 7/1999 | Takagi et al. |
| 6,034,882 A | 3/2000 | Johnson et al. |
| 6,051,851 A | 4/2000 | Ohmi et al. |
| 6,097,077 A * | 8/2000 | Gordon et al. ................ 257/530 |
| 6,288,437 B1 | 9/2001 | Forbes et al. |
| 6,465,282 B1 | 10/2002 | Többen et al. |

(Continued)

FOREIGN PATENT DOCUMENTS

EP 0 680 087 11/1995

(Continued)

OTHER PUBLICATIONS

B. Cronquist et al., "Modifications of COTS FPGA Devices for Space Applications", Actel Corporation, 1998, pp. 1-5.

(Continued)

*Primary Examiner* — Kenneth Parker
*Assistant Examiner* — Paul Budd
(74) *Attorney, Agent, or Firm* — Eric J. Robinson; Robinson Intellectual Property Law Office, P.C.

(57) ABSTRACT

An object is to provide a semiconductor device mounted with memory which can be driven in the ranges of a current value and a voltage value which can be generated from a wireless signal. Another object is to provide write-once read-many memory to which data can be written anytime after manufacture of a semiconductor device. An antenna, antifuse-type ROM, and a driver circuit are formed over an insulating substrate. Of a pair of electrodes included in the antifuse-type ROM, the other of the pair of the electrodes is also formed through the same step and of the same material as a source electrode and a drain electrode of a transistor included in the driver circuit.

22 Claims, 15 Drawing Sheets

U.S. PATENT DOCUMENTS

| | | |
|---|---|---|
| 6,525,399 B2 | 2/2003 | Cutter et al. |
| 6,528,815 B1 | 3/2003 | Brown et al. |
| 6,750,530 B1 | 6/2004 | Klaasen et al. |
| 6,795,339 B2 | 9/2004 | Ooishi |
| 6,809,952 B2 | 10/2004 | Masui |
| 6,828,685 B2 | 12/2004 | Stasiak |
| 6,844,609 B2 | 1/2005 | Motsiff et al. |
| 6,903,958 B2 | 6/2005 | Bernds et al. |
| 6,950,331 B2 | 9/2005 | Yang et al. |
| 6,962,844 B2 | 11/2005 | Stasiak |
| 6,979,880 B2 | 12/2005 | Bhattacharyya et al. |
| 7,034,380 B2 | 4/2006 | Andideh |
| 7,087,975 B2 | 8/2006 | Lehmann et al. |
| 7,358,590 B2 | 4/2008 | Yukawa et al. |
| 7,658,333 B2 | 2/2010 | Koyama et al. |
| 7,687,327 B2 | 3/2010 | Cleeves et al. |
| 2004/0129960 A1 | 7/2004 | Maruyama et al. |
| 2004/0164302 A1 | 8/2004 | Arai et al. |
| 2005/0006640 A1 | 1/2005 | Jackson et al. |
| 2005/0070060 A1* | 3/2005 | Walker et al. ............ 438/200 |
| 2005/0174845 A1 | 8/2005 | Koyama et al. |
| 2006/0097250 A1 | 5/2006 | Koyama et al. |
| 2006/0175648 A1 | 8/2006 | Asami |
| 2006/0263634 A1 | 11/2006 | Yamazaki |

FOREIGN PATENT DOCUMENTS

| | | |
|---|---|---|
| JP | 56-044198 | 4/1981 |
| JP | 04-028249 | 1/1992 |
| JP | 04-373147 | 12/1992 |
| JP | 07-297293 | 11/1995 |
| JP | 08-078532 | 3/1996 |
| JP | 3501416 | 3/2004 |
| JP | 2004-214281 | 7/2004 |
| JP | 2005-251183 | 9/2005 |
| JP | 2006-107470 | 4/2006 |
| JP | 2006-114875 | 4/2006 |
| JP | 2007-059880 | 3/2007 |
| WO | WO 96/07300 | 3/1996 |
| WO | WO 2004/015778 | 2/2004 |
| WO | WO 2005/096380 | 10/2005 |
| WO | WO 2005/119779 | 12/2005 |
| WO | WO 2006/028231 | 3/2006 |

OTHER PUBLICATIONS

International Search Report (Application No. PCT/JP2007/069329) dated Dec. 25, 2007.

Written Opinion (Application No. PCT/JP2007/069329) dated Dec. 25, 2007.

* cited by examiner

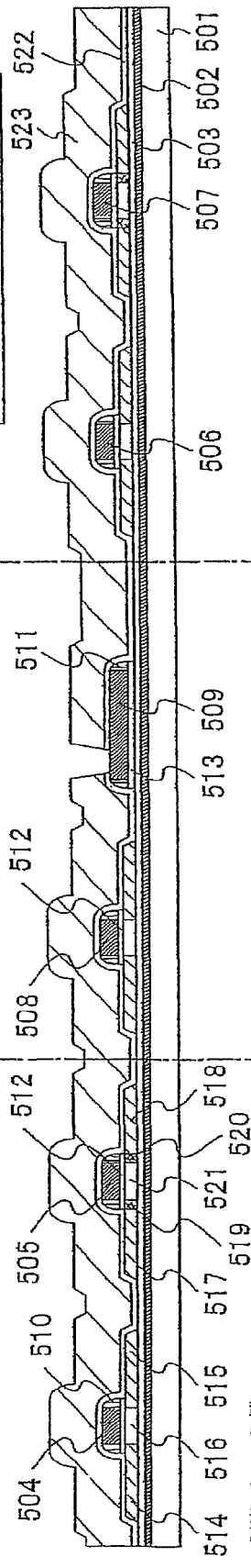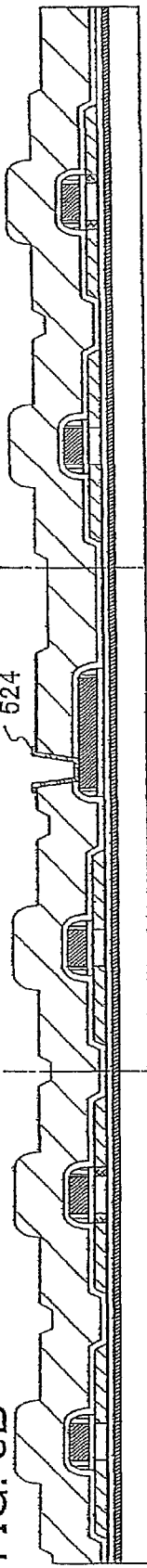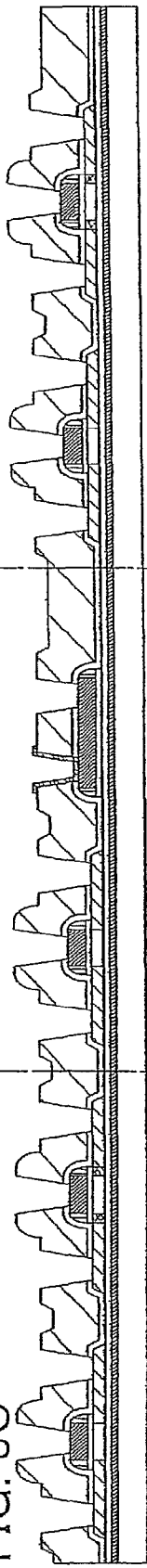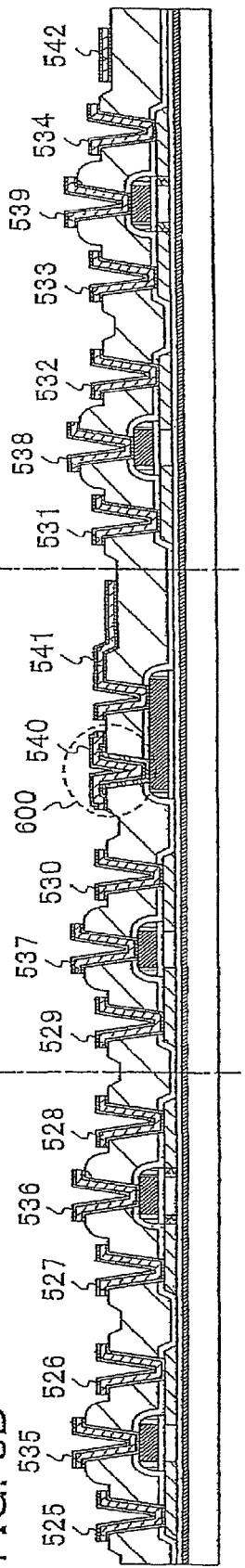

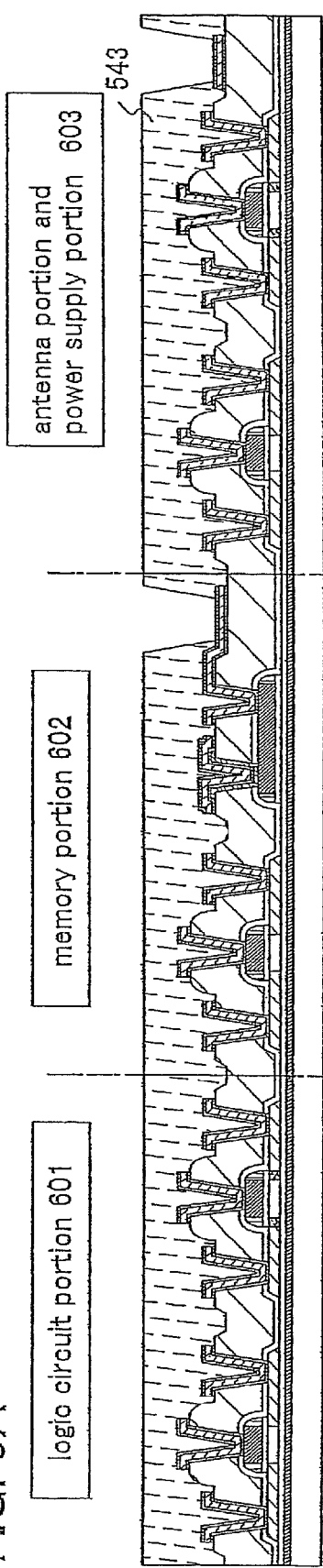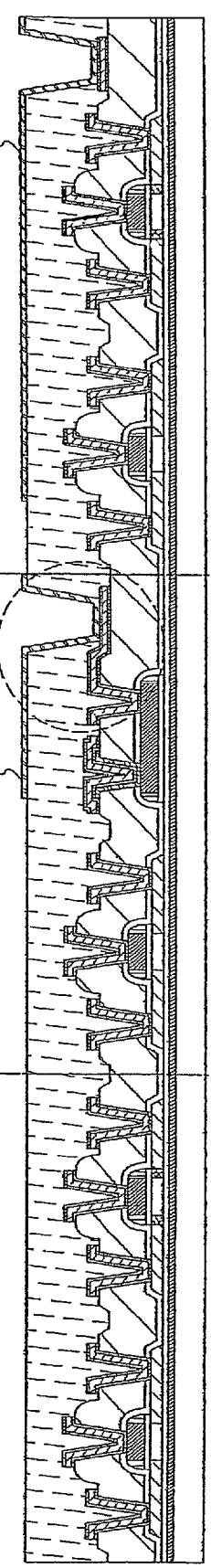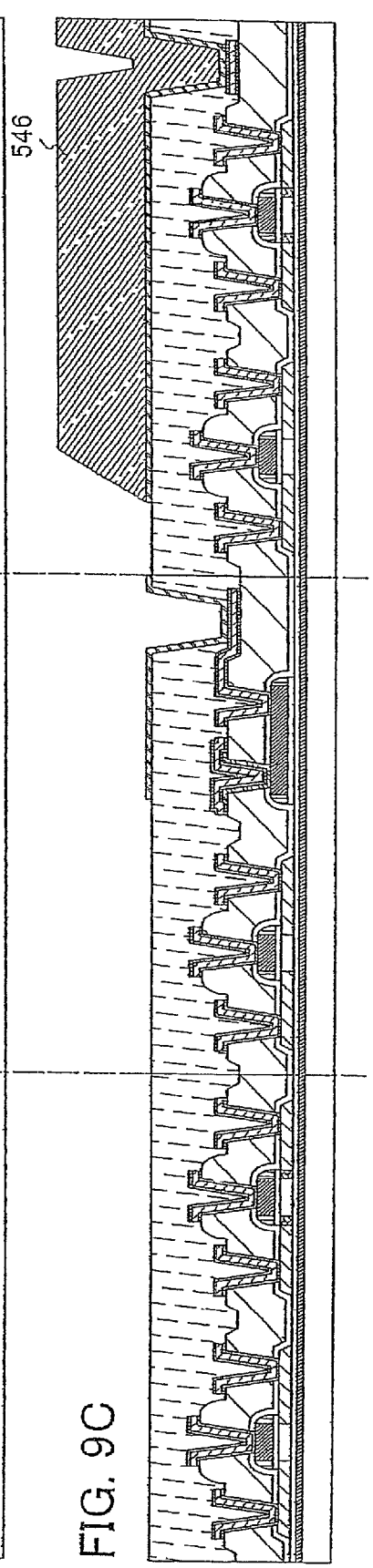

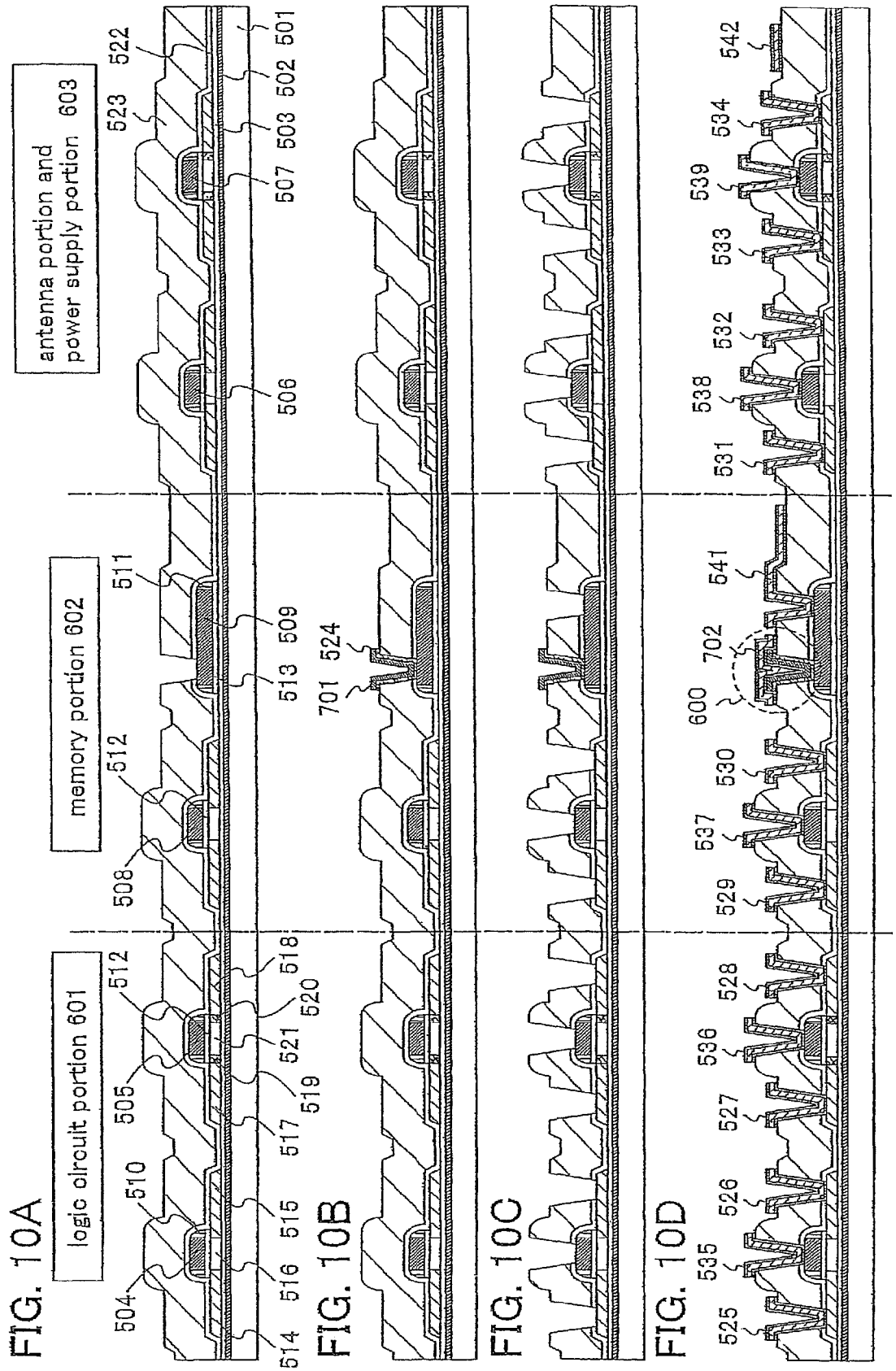

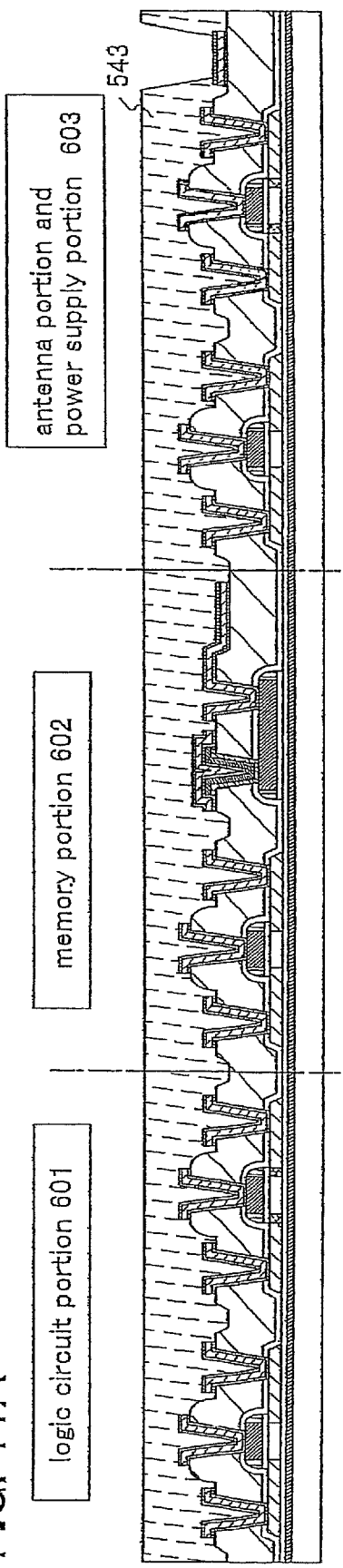
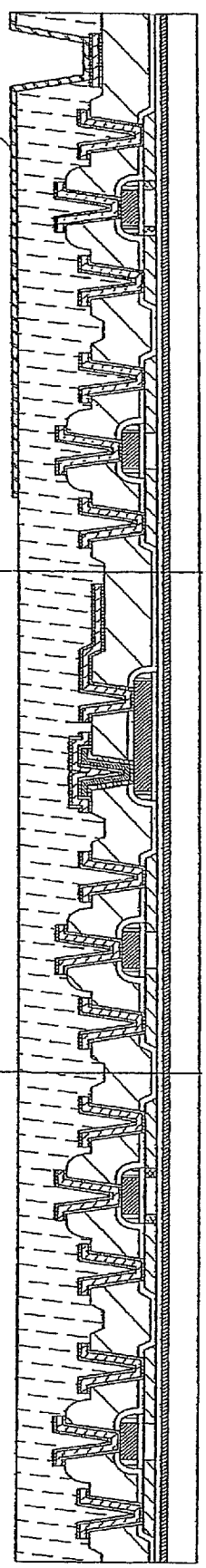
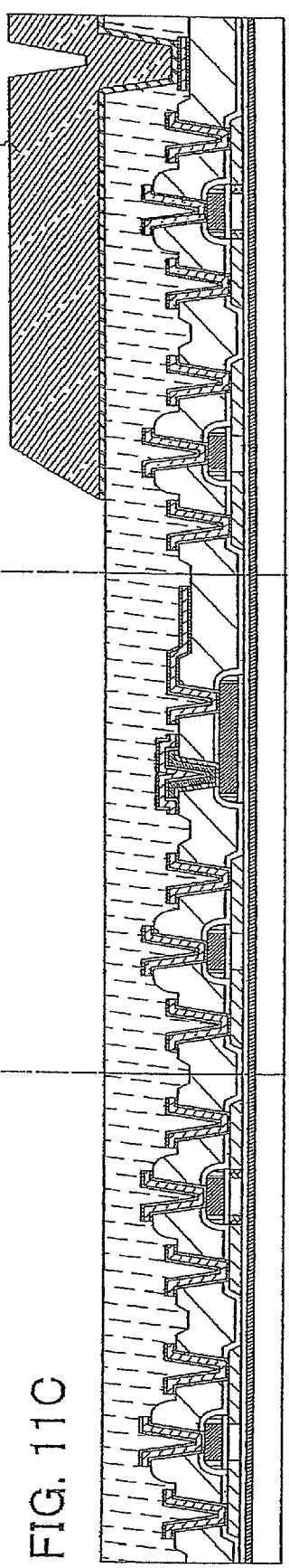
FIG. 11A
FIG. 11B
FIG. 11C
logic circuit portion 601
memory portion 602
antenna portion and power supply portion 603

SEMICONDUCTOR DEVICE WITH DRIVER CIRCUIT AND MEMORY ELEMENT

TECHNICAL FIELD

The present invention relates to a semiconductor device having a circuit including a thin film transistor (hereinafter, referred to as a TFT) and a manufacturing method thereof. For example, the present invention relates to an electronic appliance in which an electro-optical device typified by a liquid crystal display panel or a light-emitting display device including an organic light-emitting element is mounted as a component.

Note that a semiconductor device in this specification refers to a general device which can function by utilizing semiconductor characteristics, and an electro-optical device, a semiconductor circuit, and an electronic appliance are all semiconductor devices.

BACKGROUND ART

Various types of memory have conventionally been proposed. As typical memory, the following can be given: memory including an electromagnetic tape or an electromagnetic disk, RAM capable of writing and reading, ROM only for reading (read only memory), and the like.

As conventional ROM, the following can be given: mask ROM which stores information with a mask in an IC manufacturing process, fuse-type ROM which stores information by melting down a fuse element with current after manufacture of an IC chip, antifuse-type ROM which stores information by short-circuiting an insulator with current after manufacture of an IC chip, and the like.

Since mask ROM stores information with a mask in an IC manufacturing process, a mask corresponding to information to be written has to be prepared, and thus, manufacturing cost has been increased. In addition, fuse-type ROM could cause malfunction due to dust generated when a fuse element is melted down.

In addition, antifuse-type ROM is more advantageous than other ROM because the antifuse-type ROM does not need a mask corresponding to information to be written at manufacture and dust is not generated when information is written to the memory. Note that the fuse-type ROM and the antifuse-type ROM differ from the mask ROM in that data can be added. In addition, the fuse-type ROM and the antifuse-type ROM can also be referred to as write-once-read-many memory. As an example of antifuse-type ROM formed over a silicon substrate, a technique described in Patent Document 1 (: Japanese Published Patent Application No. H7-297293) is given.

FIG. 15 shows a cross-sectional view of antifuse-type ROM disclosed in Patent Document 1. In FIG. 15, a silicon substrate 50 over which an nMOS transistor is formed, an amorphous silicon film 53, a tungsten film 54, a tungsten film 54', and an Al—Si—Cu wiring 55 are formed. Although reference numerals 51 and 52 are not clearly identified in Patent Document 1, the reference numeral 51 is probably an $n^+$ drain region and the reference numeral 52 is probably a $SiO_2$ film formed by a CVD method. Patent Document 1 is characterized in that the tungsten film 54', the amorphous silicon film 53, and the tungsten film 54 which form a stacked film are consecutively formed with a multi-chamber system without being exposed to the air.

In recent years, a semiconductor device with a wireless communication function, specifically a wireless chip, has been expected to have a large market, thereby having attracted attention. Such a wireless chip is referred to as an ID tag, an IC tag, an IC chip, an RF (radio frequency) tag, a wireless tag, an electronic tag, and an RFID (radio frequency identification) in accordance with usage.

A wireless chip includes an interface, memory, a control portion, and the like. As the memory, RAM capable of writing and reading and ROM only for reading are used, and they are separately used in accordance with purposes. Specifically, a memory region is assigned for each specified application, and an access right is managed for each application and each directory. In order to manage the access right, the wireless chip has a verification unit which compares and verifies a private code of application and a control unit which gives users the access right regarding the application to which the private code is identical, according to the comparison and verification by the verification unit. Such a wireless chip is formed using a silicon wafer, and integrated circuits such as a memory circuit and an arithmetic circuit are integrated over a semiconductor substrate.

When a card to which such a wireless chip is mounted (a so-called IC card) is compared to a magnetic card, the IC card has advantages of having a large memory capacity, an arithmetic function, high authentication accuracy, and great difficulty in falsification. Therefore, the IC card is suitable for management of personal information. ROM only for reading is commonly used as memory mounted to an IC card so that falsification is impossible.

DISCLOSURE OF INVENTION

A conventional wireless chip is manufactured using an expensive silicon wafer similarly to a microprocessor or semiconductor memory. Therefore, there has been an inevitable limit to reduce unit cost of the wireless chip. In particular, a memory region which is needed for the wireless chip occupies a large area in a silicon chip, and it has been necessary to reduce the area occupied by the memory region without changing memory capacity for reducing the unit cost of the chip. In addition, although reduction in cost can be expected by reduction in the size of the silicon chip, if reduction in the size of the silicon chip proceeds, mounting cost of the silicon chip is increased. In order to distribute the chip to the market, it is very important to reduce the unit cost of the chip; which is one of priorities in commodity production.

In the wireless chip, in the case where a terminal of the silicon chip and an antenna are connected to each other with an ACF or the like, a ratio of heat expansion when a temperature becomes high or a ratio of heat shrink when a temperature becomes low is different depending on a component; thus, high thermal stress is generated between different components. Since the wireless chip is attached to an article, in view of being exposed under various environments, a connection portion of the terminal of the silicon chip and the antenna might be disconnected due to thermal stress.

In addition, the conventional wireless chip is not suitable for being attached to a curved surface of an article even if it is a smaller piece because it uses silicon for a structure. In the case where a silicon chip has been mounted to a substrate formed of a flexible material, a connection portion of the silicon chip and an antenna of the substrate could have been destroyed when the substrate has been bent in accordance with the curved surface of the article. Although there has been a method of grinding and polishing a silicon wafer itself to thin the silicon wafer, the number of steps is increased due to the step, and thus, it has been contradictory to reduction in manufacturing cost. Even if a wireless chip is thinned, in the case of an IC tag which is attached to an article to be used, when the wireless chip is attached to a thin substrate (e.g., strip of film or slip of paper), disfigurement is caused because a protrusion is generated on a surface of the substrate. In addition, since a protrusion is generated on the surface of the substrate, in the case of performing printing to a substrate such as slip of paper, high-definition printing becomes difficult. Moreover, a location where a silicon chip which is an object to be falsified exists could have been emphasized. Furthermore, when a silicon chip has been thinned, mechanical strength of the silicon chip could have been decreased and the silicon chip could have been broken when a substrate is bent.

In the case where antifuse-type ROM is mounted to a wireless chip, two process sequences are considered. One is a process sequence in which information is written after manufacture of a silicon chip in which ROM is formed, and then the silicon chip is mounted with an antenna provided for a substrate, so that a wireless chip is completed. When such a process sequence is employed, a manufacturing device for writing information during manufacturing process of the wireless chip is needed. Each silicon chip is minute, and a manufacturing device for supplying current for writing different information to ROM formed in each silicon chip needs precision location alignment or the like, thereby being expensive. Therefore, manufacturing cost is increased due to this manufacturing device.

The other is a process sequence in which after a silicon chip is mounted on a substrate having an antenna, a wireless signal is transmitted to the ROM formed in the silicon chip, and information is written using the wireless signal, so that a wireless chip is completed. In comparison with the former process sequence, increase in manufacturing cost can be suppressed with the utilization of a wireless signal when such a process sequence is employed.

However, in the case of employing the latter process sequence, information is written to the ROM with the utilization of current generated from the wireless signal, and thus, a writing current value and a writing voltage value to the ROM are restricted.

It is an object of the present invention to provide a semiconductor device mounted with memory which can be driven in the ranges of a current value and a voltage value which can be generated from a wireless signal. It is another object to provide write-once read-many memory to which data can be written anytime after manufacture of a semiconductor device.

It is another object to provide a wireless chip which is suitable for being attached to a curved surface of an article. It is another object to reduce manufacturing cost and unit cost of a chip without increasing the number of manufacturing steps.

Since a wireless chip is required to perform data communication with a reader in a short period of time; thus, it is another object to provide a wireless chip which performs fast reading and has less malfunction. It is another object to reduce power consumption of memory by reduction of electric power for data reading of the memory and to achieve lower power consumption of a whole wireless chip.

It has been found that antifuse-type ROM is formed over the same substrate as a driver circuit, preferably, an insulating substrate, so that at least one of the above-described objects is realized. In addition, according to the present invention, the antifuse-type ROM and the driver circuit are formed over the same substrate, so that noise or contact resistance can be reduced and lower power consumption of a whole wireless chip can be achieved. Further preferably, an antenna, antifuse-type ROM, and a driver circuit are formed over an insulating substrate. When the antenna, the antifuse-type ROM, and the driver circuit are located over the same substrate, a power supply signal is formed based on a signal from an antenna which receives a wireless signal, and the power supply signal can be efficiently utilized without loss.

The antifuse-type ROM includes a pair of electrodes each of which is formed of a different material and a silicon film which is interposed between the pair of electrodes. The materials of the pair of electrodes may be acceptable as long as they are materials which react with silicon to form a silicide. For the material, a simple substance such as titanium, tungsten, nickel, chromium, molybdenum, tantalum, cobalt, zirconium, vanadium, palladium, hafnium, platinum, or iron, or an alloy or a compound thereof can be used.

Besides, one of the pair of electrodes included in the antifuse-type ROM is formed through the same step and of the same material as a gate electrode of a transistor included in a driver circuit, so that simplification of a process can be achieved. According to the present invention, the antifuse-type ROM and the driver circuit are formed over the same substrate, so that noise or contact resistance can be reduced and lower power consumption of the whole wireless chip can be achieved. Since data communication with a reader in a short period of time is required, a TFT using a semiconductor film having a crystal structure, that is, a polysilicon film is preferably used as the transistor of the driver circuit. In order to obtain a TFT with preferable electric characteristics, a material of the gate electrode of the transistor is preferably a high melting point metal. Of high melting point metals, a tungsten film which reacts with silicon to form a silicide is a material which has a comparatively high work function; therefore, threshold voltage of both a p-channel transistor and an n-channel transistor is low and the both transistors are roughly symmetric to each other. That is, it can be said that the tungsten film is suitable for the driver circuit including a CMOS circuit and also for one of the pair of electrodes of the antifuse-type ROM.

Furthermore, also the other of the pair of the electrodes included in the antifuse-type ROM is formed through the same step and of the same material as a source electrode and a drain electrode of the transistor included in the driver circuit, so that simplification of the process can be achieved. Since the source electrode and the drain electrode of the transistor are formed over an interlayer insulating film to be in contact with the interlayer insulating film, they are preferably formed of a material which has high adhesion with the interlayer insulating film. In addition, a light metal of which specific gravity is less than or equal to 5 is used for the source electrode and the drain electrode of the transistor. Since a light metal such as aluminum or titanium has low electric resistance, it is useful as a wiring material of an integrated circuit. In addition, it is preferable to use a titanium film because adhesion with an insulating film or other metal film is improved. Moreover, the titanium film has lower material cost and electric resistance than a high melting point metal. That is, it can be said that the titanium film is suitable for the source electrode and the drain electrode of the transistor and also for one of the pair of the electrodes of the antifuse-type ROM.

As described above, it is useful to differentiate materials of a first electrode and a second electrode which are the pair of electrodes of the antifuse-type ROM in order to reduce manufacturing cost as much as possible.

Besides, the other of the pair of electrodes included in the antifuse-type ROM is formed through the same step and of the same material as a connection electrode for electrically connecting an antenna to the driver circuit, so that simplification of the process can be achieved. The antifuse-type ROM, the driver circuit, and the antenna are formed over the same substrate, so that noise or contact resistance can be reduced and lower power consumption of the whole wireless chip can be achieved.

An amorphous silicon film, a microcrystalline silicon film, or a polycrystalline silicon film (also referred to as a polysilicon film) can be used as a silicon film for the antifuse-type ROM. In addition, oxygen or nitrogen may be purposely contained in the silicon film used for the antifuse-type ROM. The amount of contained oxygen or nitrogen is greater than or equal to the SIMS lower detection limit, preferably, greater than or equal to $1\times10^{15}/cm^3$ and less than $1\times10^{20}/cm^3$. Oxygen or nitrogen is purposely contained, so that a difference in electric resistance between before and after writing of the antifuse-type ROM can be increased. The difference in the electric resistance between before and after writing is increased, so that a wireless chip with less malfunction can be provided.

Alternatively, germanium may be added to the silicon film used for the antifuse-type ROM. Since germanium has lower energy for reaction with another metal element than silicon, a writing voltage value of the antifuse-type ROM can be reduced. Alternatively, a germanium film or a germanium film containing silicon may be used instead of the silicon film used for the antifuse-type ROM.

An overall structure including a substrate of the antifuse-type ROM of the present invention greatly differs from that of the antifuse-type ROM described in Patent Document 1. In the antifuse-type ROM described in Patent Document 1, a silicon substrate that is a conductor which blocks a wireless signal is used; thus, the antifuse-type ROM is unsuitable for wireless communication. There is no description on wireless communication in Patent Document 1; however, even if an antenna is provided for the antifuse-type ROM described in Patent Document 1, electric waves can be transmitted/received only to/from a surface where the antenna is formed. Besides, noise is increased due to inductive current generated in the silicon substrate, and accordingly, communication sensitivity could be significantly reduced. The antifuse-type ROM of the present invention greatly differs from the antifuse-type ROM described in Patent Document 1 in that the insulating substrate is used. The insulating substrate such as a glass substrate or a plastic substrate does not block a wireless signal, and thus electric waves can be transmitted/received to/from various directions other than a surface where the antenna is formed. In addition, as for the antifuse-type ROM of the present invention, inductive current is not generated in the substrate, and thus noise is not increased and preferable communication sensitivity can be realized.

In the technique described in Patent Document 1, as shown in FIG. 15, the tungsten film 54, the amorphous silicon film 53, and the tungsten film 54' are consecutively formed by a CVD method without being exposed to the air. Therefore, a step of the antifuse-type ROM is simply added to a conventional step of an nMOS transistor, and accordingly, the total number of steps is large. Differently from the semiconductor device described in Patent Document 1, in the semiconductor device of the present invention, the gate electrode of the TFT of the driver circuit is formed through the same step as one of the electrodes of the antifuse-type ROM to reduce the number of steps. Note that since Patent Document 1 is mainly characterized in that the tungsten film 54, the amorphous silicon film 53, and the tungsten film 54' are consecutively formed without being exposed to the air, forming a gate electrode of a transistor and one of electrodes of the antifuse-type ROM through the same step as in the manufacturing process of the present invention is not assumed at all; accordingly, the manufacturing process of the semiconductor device of Patent Document 1 greatly differs from that of the semiconductor device of the present invention.

In addition, the antifuse-type ROM of the present invention can be formed over an insulating substrate such as a glass substrate or a plastic substrate, peeled from the insulating substrate, and transferred to slit of paper or strip of film. In a thus formed wireless chip using the slip of paper as a substrate, a protrusion is hardly generated on a surface in comparison with a wireless chip using a silicon chip. Therefore, even in the case where printing is further performed to the wireless chip using the slip of paper as a substrate, high-definition printing is possible. Moreover, in a conventional wireless chip, a connection portion of the silicon chip and an antenna of the substrate could have been destroyed when the substrate has been bent in accordance with the curved surface of the article. However, in the wireless chip of the present invention, since the antenna, the antifuse-type ROM, and the driver circuit are formed over the same substrate, a flexible wireless chip can be realized.

The driver circuit of the semiconductor device of the present invention includes at least one of a writing circuit to the antifuse-type ROM, a reading circuit to the antifuse-type ROM, a voltage generation circuit such as a booster circuit, a clock generation circuit, a timing control circuit, a sense amplifier, an output circuit, and a signal processing circuit such as a buffer. In addition, the driver circuit of the semiconductor device of the present invention may have a structure to which other component such as a limiter circuit of power supply voltage or hardware only for processing codes is added.

The antifuse-type ROM to be mounted to the semiconductor device of the present invention may be either an active matrix memory device or a passive matrix memory device. In either case, formation of the driver circuit over the same substrate as the antifuse-type ROM makes it possible to realize at least one of the objects of the present invention. In the case of the active matrix memory device, a switching element is provided for one antifuse-type ROM, and the antifuse-type ROMs each provided with the switching element are arranged in matrix. In the case of the passive matrix (simple matrix) memory device, a structure is employed in which a plurality of bit lines arranged in parallel in a stripe form (strip form) and a plurality of word lines arranged in parallel in a stripe form are provided so as to be at right angles to each other, and a material layer is interposed therebetween at each crossing portion. Accordingly, writing processing of a memory element at an intersecting point of a selected bit line (a bit line to which voltage is added) and a selected word line is performed, or reading processing thereof is performed.

A semiconductor device mounted with memory which can be driven in the ranges of a current value and a voltage value which can be generated from a wireless signal can be realized, and also unit cost of a chip can be reduced. Furthermore, by reduction of a writing voltage value, a voltage value formed by a booster circuit or the like from a signal obtained by an antenna can be reduced, and reduction in a plane area of a driver circuit of the memory can be realized. Accordingly, in the case where the antifuse-type ROM is mounted to a chip, an area of the chip occupied by the driver circuit can be reduced.

BRIEF DESCRIPTION OF THE DRAWINGS

In the accompanying drawings.

FIGS. 8A to 8D are cross-sectional diagrams illustrating manufacturing steps of a wireless chip;

FIGS. 9A to 9C are cross-sectional diagrams illustrating manufacturing steps of a wireless chip;

FIGS. 10A to 10D are cross-sectional diagrams illustrating manufacturing steps of a wireless chip;

FIGS. 11A to 11C are cross-sectional diagrams illustrating manufacturing steps of a wireless chip;

BEST MODE FOR CARRYING OUT THE INVENTION

Embodiment Mode

Figure 1A:
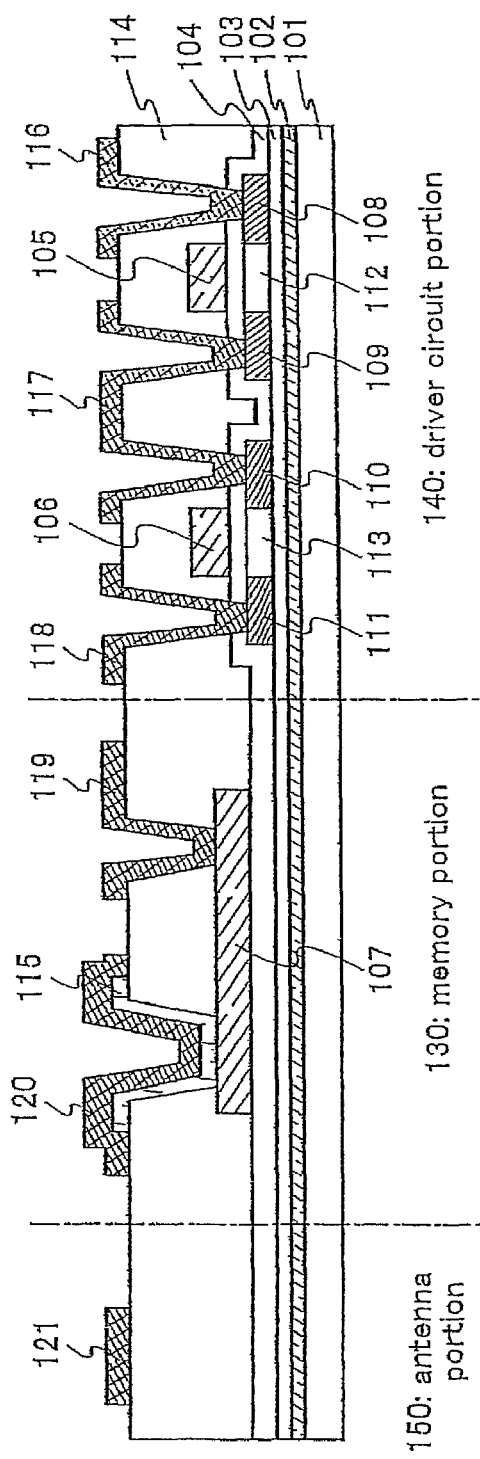
FIGS. 1A and 1B are cross-sectional diagrams of a process of the present invention.

Embodiment Mode of the present invention will be hereinafter explained. However, it is easily understood by those skilled in the art that the present invention is not limited to the following description, and modes and details of the present invention can be modified in various ways without departing from the purpose and the scope of the present invention. Therefore, the present invention should not be interpreted as being limited to the description of Embodiment Mode. Note that, in the structure of the present invention hereinafter explained, reference numerals denoting the same portions are used in common in different drawings.

Figure 1B:
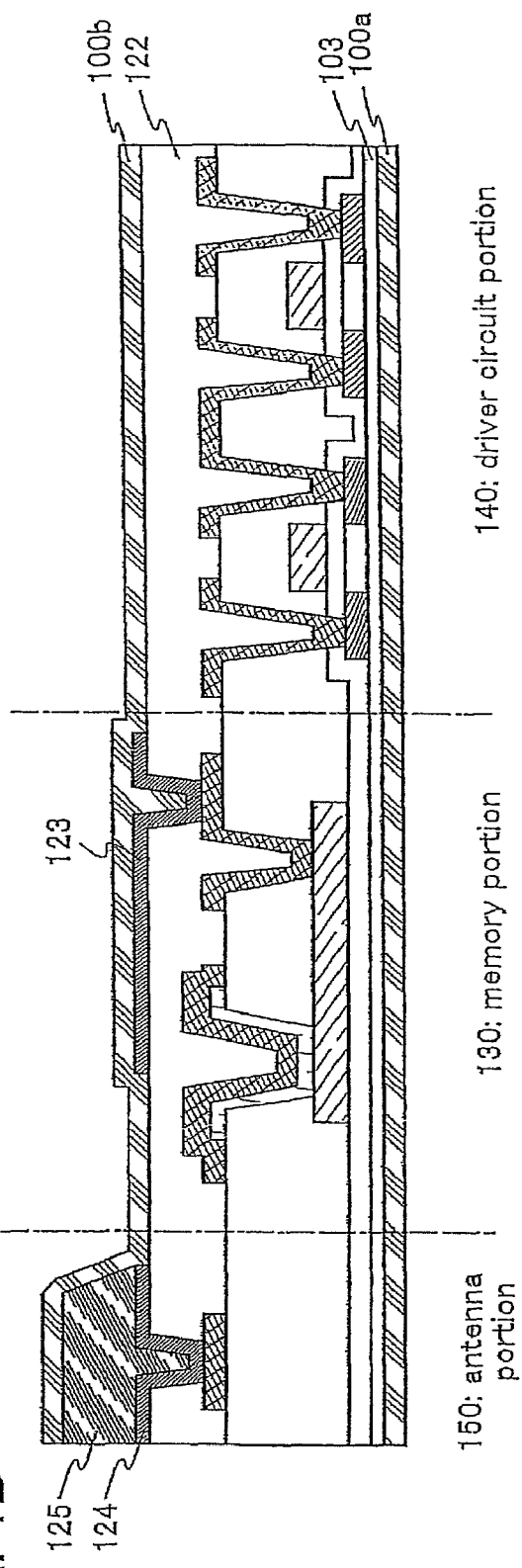

A manufacturing process of a semiconductor device of the present invention will be explained with reference to FIGS. 1A and 1B. A cross-sectional structure shown in FIG. 1A is a process diagram in the middle of manufacturing process of the semiconductor device.

First, a peeling layer 102 and an insulating layer 103 are formed over a substrate 101 with an insulating surface. A quartz substrate, a glass substrate, or the like can be used as the substrate 101 with an insulating surface. In particular, a glass substrate which can have large area of over 1 m on each side is suitable for mass production. A tungsten film with a thickness of 50 to 200 nm is used for the peeling layer 102 and a silicon oxide film is used for the insulating layer 103. Note that the peeling layer 102 is not limited to a tungsten film, and a tungsten nitride film, a molybdenum film, an amorphous silicon film, or the like may be used. In addition, the insulating layer 103 is not limited to a silicon oxide film, and a silicon oxynitride film or a stacked film of a silicon oxide film and silicon oxynitride film can be used.

Next, a plurality of semiconductor layers are formed over the insulating layer 103. The plurality of semiconductor layers may be formed by a known method. Here, a semiconductor film having a crystal structure is used, which is formed in such a manner that an amorphous silicon film is formed by a known method (e.g., a sputtering method, an LPCVD method, or a plasma CVD method), and then the amorphous silicon film is crystallized by known crystallization treatment (e.g., a laser crystallization method, a thermal crystallization method, or a thermal crystallization method using a catalyst such as nickel). The plurality of semiconductor layers serve as an active layer of a thin film transistor to be manufactured later. It is preferable to use a semiconductor film having a crystal structure for the active layer of a thin film transistor in order to realize high-speed driving of a driver circuit. High-speed driving of the driver circuit is realized, so that high-speed reading of memory can be realized.

Next, a gate insulating film 104 which covers the plurality of semiconductor layers is formed. The gate insulating film 104 is formed of a single layer or a stacked-layer of an insulating film containing silicon. The gate insulating film 104 is formed to have a thickness of 1 to 200 nm by a plasma CVD method or a sputtering method. Alternatively, the gate insulating film 104 may be formed in such a manner that an insulating film containing silicon is formed to be as thin as 10 to 50 nm with a single layer structure or a stacked layer structure, and surface nitriding treatment using microwave plasma is performed to the insulating film.

Next, a first gate electrode 105 and a second gate electrode 106 which overlap with the semiconductor layer with the gate insulating film 104 interposed therebetween and one of electrodes of antifuse-type ROM, that is, a first gate electrode 107 are formed in the same step. The first gate electrode 105, the second gate electrode 106, and the first electrode 107 may be formed in such a manner that a conductive film formed of a single substance such as titanium, tungsten, nickel, chromium, molybdenum, tantalum, cobalt, zirconium, vanadium, palladium, hafnium, platinum, or iron, an alloy thereof, or a compound thereof is formed by a sputtering method and processed into a desired shape. A material which has both a characteristic suitable for the gate electrode of a TFT and a characteristic suitable for one of the electrodes of the antifuse-type ROM is selected. In this embodiment mode, a tungsten film is used. The tungsten film reacts with silicon to form a silicide, thereby being suitable for one of the electrodes of the antifuse-type ROM. Furthermore, since the tungsten film is a material which has a comparatively high work function, threshold voltage of both a p-channel transistor and an n-channel transistor is low, and the p-channel transistor and the n-channel transistor are roughly symmetric to each other; thus, the tungsten film is one of preferable materials for the gate electrode.

Next, in order to add an impurity element imparting n-type conductivity, steps of forming a first resist mask which covers a region to be the p-channel TFT and performing doping with the use of the first resist mask and the first gate electrode 105 as masks are performed. The impurity element imparting n-type conductivity is added to the semiconductor film, so that n-type impurity regions are formed in a self-aligned manner. These n-type impurity regions serve as a source region 108 or a drain region 109 of an n-channel TFT. In addition, a region of the semiconductor layer which overlaps with the first gate electrode 105 serves as a channel formation region 112. The step of doping may be performed by ion doping or ion implantation. As the impurity element imparting n-type conductivity which is added to the semiconductor layer, phosphorus (P) or arsenic (As) is typically used.

Then, after the first resist mask is removed, in order to add an impurity element imparting p-type conductivity to the semiconductor layer, steps of forming a second resist mask which covers a region to be the n-channel TFT and performing doping with the use of the second resist mask and the second gate electrode 106 as masks are performed. The impurity element imparting p-type conductivity (typically, boron) is added to the semiconductor film, so that p-type impurity regions are formed in a self-aligned manner. These p-type impurity regions serve as a source region 111 or a drain region 110 of the p-channel TFT. In addition, a region of the semiconductor layer which overlaps with the second gate electrode 106 serves as a channel formation region 113.

Thereafter, the second resist mask is removed. Through the preceding steps, the impurity regions with n-type or p-type conductivity are formed in each semiconductor layer. Note that although the example in which the impurity element imparting n-type conductivity is added before the impurity element imparting p-type conductivity is added is described here, there is no particular limitation on the doping order.

In addition, before these doping steps, an insulator which is referred to as a sidewall may be fainted on sidewalls of the gate electrode and LDD regions which are adjacent to the channel formation region may be formed. The LDD region may be formed using a new resist mask although the number of masks is increased. A region to which an impurity element is added at a low concentration is provided between a channel formation region and a source region or a drain region which is formed by addition of an impurity element at a high concentration, and the region is referred to as an LDD region. When the LDD region is provided, an off current value of the TFT can be reduced.

In addition, if necessary, a small amount of impurity elements (boron or phosphorus) may be added to the semiconductor layer in order to control a threshold of the TFT.

Next, activation of the impurity element added to the semiconductor layer or hydrogenation of the semiconductor layer is performed by a known technique. The activation of the impurity element or the hydrogenation of the semiconductor layer is performed by high-temperature heat treatment in a furnace or heat treatment using lamp light or laser light; therefore, a material which can withstand a treatment temperature is used for the first gate electrode 105, the second gate electrode 106, and the first electrode 107 which are formed before the activation step or the hydrogenation step. Needless to say, the tungsten film which is used here for the first gate electrode 105, the second gate electrode 106, and the first electrode 107 is a high melting point metal and is a material which can sufficiently withstand the activation of the impurity element or the hydrogenation of the semiconductor layer.

Next, an interlayer insulating film 114 which covers the first gate electrode 105, the second gate electrode 106, and the first electrode 107 is foamed. The interlayer insulating film 114 is formed of an inorganic insulating film by a sputtering method, an LPCVD method, a plasma CVD method, or the like. A single layer or a stacked layer of an insulating film such as a silicon oxide film, a silicon nitride film, or a silicon oxynitride film is used for the inorganic insulating film. This interlayer insulating film 114 also functions as a partition wall which insulates adjacent memory elements. Since voltage is applied to the antifuse-type ROM to generate a silicide reaction, an area around the memory element instantaneously has high temperature. Therefore, the interlayer insulating film 114 is preferably formed of an inorganic insulating material which can withstand a temperature by which a silicide reaction is generated.

Alternatively, as one layer of the inorganic insulating film, a siloxane resin with high heat resistance which can be obtained by an application method may be used. Note that a siloxane resin corresponds to a resin containing a Si—O—Si bond. Siloxane has a skeleton structure including a bond of silicon (Si) and oxygen (O). As a substituent, an organic group containing at least hydrogen (e.g., an alkyl group or aromatic hydrocarbon) is used. Alternatively, a fluoro group may be used as the substituent. Further alternatively, an organic group containing at least hydrogen and a fluoro group may be used as the substituent.

Next, a resist mask is formed using a photomask, and either the interlayer insulating film 114 and the gate insulating film 104 or the interlayer insulating film 114 is selectively etched to form an opening. As the etching, wet etching or dry etching may be performed, or a combination thereof may be performed. Then, the resist mask is removed. There are three types for the opening formed here: an opening reaching the semiconductor layer, an opening reaching the gate electrode of the TFT, and an opening reaching the first electrode 107. Furthermore, two types of openings reaching the first electrode 107 are provided: a first opening for stacking a silicon film later and a second opening forming a wiring which is electrically connected to the first electrode 107.

Figure 2:
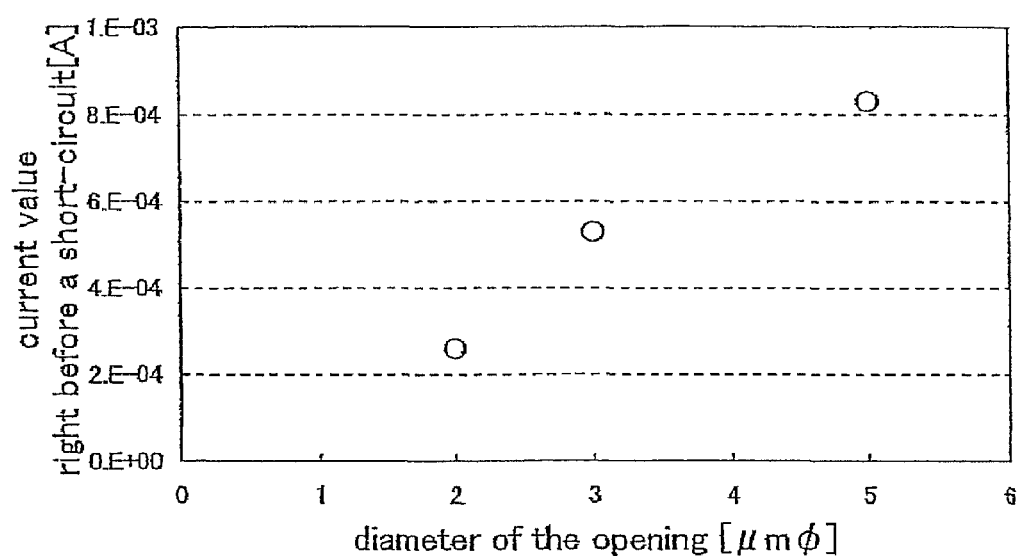
FIG. 2 is a graph showing a relation between a current value right before a short-circuit of antifuse-type ROM and a diameter of an opening.

The first opening reaching the first electrode 107, which is formed in this etching step, has a diameter of its bottom surface of about 1 to 6 µm. However, as shown in the graph of FIG. 2, the first opening is preferably small because current consumption is increased as the diameter of the first opening becomes larger. Note that although the size of the opening is indicated by diameter, a shape of a top surface of the opening is not limited to round, and oblong or rectangle may also be employed. In the graph of FIG. 2, a vertical axis indicates a current value right before a short-circuit of the antifuse-type ROM and a horizontal axis indicates the diameter of the first opening. Note that data of FIG. 2 was obtained from a measurement using an amorphous silicon film with a thickness of 200 nm formed by a sputtering method as a silicon film of the antifuse-type ROM. In addition, even when an amorphous silicon film formed by a plasma CVD method was used as the silicon film of the antifuse-type ROM, a relation between the diameter of the opening and the current value right before a short-circuit showed a similar tendency to that when the amorphous silicon film formed by a sputtering method was used.

In addition, in order to reduce the number of steps, the opening reaching the semiconductor layer, the opening reaching the gate electrode of the TFT, and the first opening and the second opening reaching the first electrode 107 can be formed by one etching by adjustment of an etching condition.

In the preceding steps, part of the antifuse-type ROM is formed through the same steps as the manufacturing steps of the TFT; therefore, the number of steps is not increased.

Next, a silicon film 115 is formed so as to overlap with the first opening reaching the first electrode 107. The silicon film 115 can be formed using an amorphous silicon film, a microcrystalline silicon film, or a polysilicon film by a sputtering method, an LPCVD method, a plasma CVD method, or the like. Here, an amorphous silicon film obtained by a plasma CVD method is used.

Figure 3:
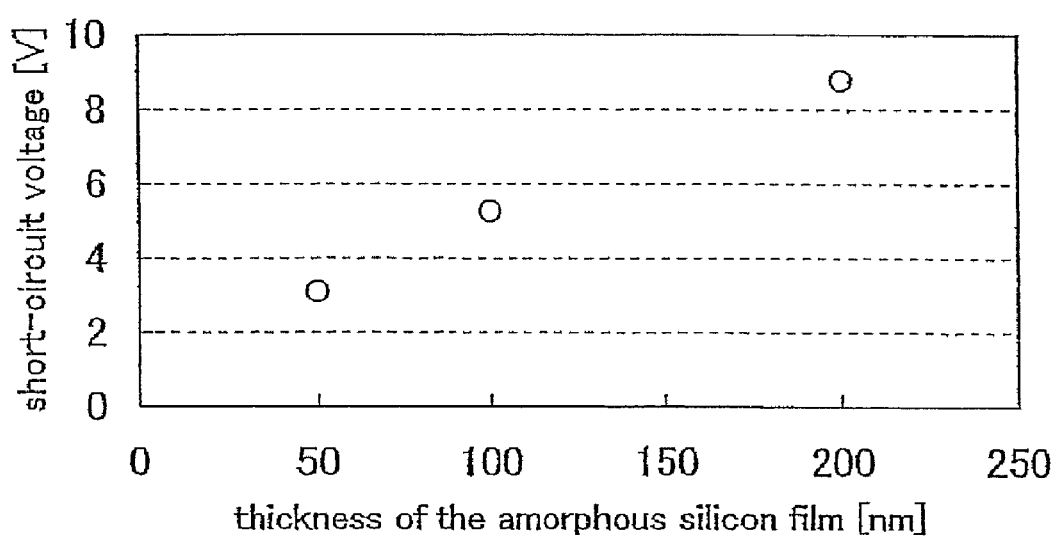
FIG. 3 is a graph showing a relation between short-circuit voltage and a thickness of a silicon film of antifuse-type ROM.

A thickness of the silicon film 115 is 10 to 200 nm. Short-circuit voltage of the antifuse-type ROM is proportional to the thickness of the silicon film 115. A graph of FIG. 3 shows a relation between the short-circuit voltage of the antifuse-type ROM having a diameter of the first opening of 2 µm and the thickness of the silicon film. Note that an amorphous silicon film formed by a sputtering method is used as the silicon film of the antifuse-type ROM from which data of the graph of FIG. 3 is obtained. According to FIG. 3, it can be read that it is preferable to reduce the thickness of the silicon film 115 when antifuse-type ROM with low short-circuit voltage is formed. The short-circuit voltage of the antifuse-type ROM can be freely set by control of the thickness of the silicon film 115. In addition, the relation between the short-circuit voltage and the thickness of the silicon film when an amorphous silicon film formed by a plasma CVD method was used as the silicon film of the antifuse-type ROM showed a similar tendency to that when the amorphous silicon film formed by a sputtering method was used.

In addition, oxygen or nitrogen may be purposely contained in the silicon film used for the antifuse-type ROM. Between the above-described etching step and step of forming the silicon film, exposure to the air is performed, so that the steps are not continuously performed. More nitrogen or oxygen is contained at an interface between the silicon film 115 and the first electrode 107 than in other region of the silicon film 115. In the antifuse-type ROM, at least the silicon film 115 and the first electrode 107 are not consecutively stacked. Oxygen or nitrogen is contained in the silicon film 115, so that a difference in electrical resistance between before and after writing of the antifuse-type ROM can be increased. In addition, when the opening is exposed to the air after being formed, a thin natural oxide film is sometimes formed on a surface of the exposed tungsten film. Moreover, also by formation of the natural oxide film on the surface of the tungsten film, the natural oxide film can function as a buffer layer, and thus, the antifuse-type ROM can sufficiently function.

Since one mask is needed for patterning this silicon film 115, the number of steps is increased due to a film formation step and a patterning step thereof.

Note that, if the silicon film 115 is selectively formed using liquid in which a high-order silane compound formed of hydrogen and silicon is dissolved in an organic solvent by a droplet discharging method such as an ink jetting method, the number of steps which is increased due to the formation of the silicon film 115 can be reduced.

Next, an exposed surface of the semiconductor layer is washed at the same time as removal of an oxide film on a surface of the semiconductor layer with an etchant containing hydrofluoric acid. Note that it is necessary to be careful so that the silicon film 115 is not etched and eliminated by this washing step.

Next, a metal film is stacked by a sputtering method. Then, a resist mask is formed using a photomask and the metal stacked film is selectively etched, so that source electrodes 116 and 118 and a drain electrode 117 of the TFT are formed in a driver circuit portion 140; a second electrode 120 and a third electrode 119 of the antifuse-type ROM are formed in a memory portion 130; and a connection electrode 121 is formed in an antenna portion 150. The connection electrode 121 is electrically connected to an antenna and a power supply formation circuit to be formed later.

In addition, the third electrode 119 is electrically connected to the first electrode 107, so that a wiring is led; accordingly, reduction in power consumption is achieved. In the case of active matrix memory, the third electrode 119 electrically connects a switching element to the first electrode 107. In the case of passive matrix memory, the first electrodes 107 may be arranged in parallel in a stripe form (strip form) and the second electrodes 120 may be arranged in parallel in a stripe form so as to be at right angles to the first electrodes 107. In the case of the passive matrix memory, the third electrode 119 is provided at an end portion to serve as a lead electrode.

Note that the metal stacked film here is a three-layer stacked structure of a titanium film with a thickness of 50 to 200 nm, a pure aluminum film with a thickness of 100 to 400 nm, and a titanium film with a thickness of 50 to 200 nm. At least a layer of the metal stacked film, which is in contact with the silicon film 115, is formed using a material which reacts with silicon to form a silicide.

In addition, since the titanium film is used for this metal stacked film, contact resistance with other conductive material is low, and furthermore, since the pure aluminum film is used and a wiring resistance value is low, it is effective to use the metal stacked film for a lead wiring of the driver circuit portion, a lead wiring of the memory portion, and a connection portion of the antenna portion.

In this manner, as shown in FIG. 1A, over the substrate 101 with an insulating surface, the peeling layer 102 and the insulating layer 103 are provided, and thereover, the antifuse-type ROM is provided in the memory portion 130, and a CMOS circuit including the n-channel TFT and the p-channel TFT is provided in the driver circuit portion 140. The second electrode 120 of the antifuse-type ROM is formed through the same step as the source electrodes 116 and 118 and the drain electrode 117 of the TFT, so that the number of steps is reduced. In addition, the connection electrode 121 of the antenna portion is formed through the same step as the source electrodes 116 and 118 and the drain electrode 117, so that contact resistance in a connection portion between the antenna and the power supply formation circuit and noise can be reduced.

Figure 4:
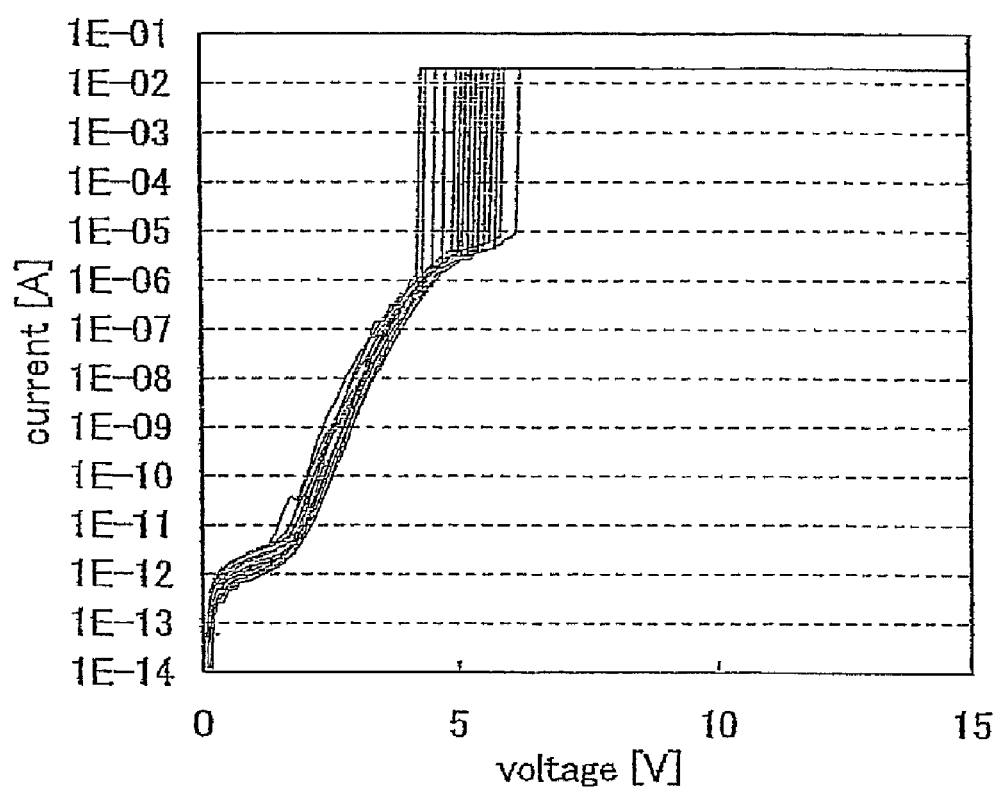
FIG. 4 is a graph showing electric characteristics of antifuse-type ROM.

Here, FIG. 4 shows a graph showing electric characteristics of the antifuse-type ROM. In FIG. 4, a vertical axis indicates current and a horizontal axis indicates applied voltage. An amorphous silicon film with a thickness of 50 nm which is formed by a plasma CVD method is used as a silicon film of the antifuse-type ROM which was measured. In addition, FIG. 4 shows measurement results of the antifuse-type ROM with a diameter of the first opening of 2 μm. The measurement was conducted for 25 elements, and a current value right before a short-circuit was in a range of 1 to 10 μA. A short-circuit of the antifuse-type ROM is confirmed in a range of applied voltage of 4 to 6 V. According to the results in FIG. 4, it can be read that this antifuse-type ROM is a memory element which is capable of writing with a low current value and low voltage.

According to the electric characteristics of the antifuse-type ROM shown in FIG. 4, it can be said that memory which can be driven in the ranges of a current value and a voltage value which can be generated from a wireless signal can be realized. That is, the antifuse-type ROM shown in FIG. 4 can reduce electric power for writing data. Furthermore, by reduction of a writing voltage value, a voltage value formed by a booster circuit or the like from a signal obtained by an antenna can be reduced, and reduction in a plane area of a driver circuit of memory can be realized. Accordingly, in the case where the antifuse-type ROM is mounted to a chip, an area of the chip occupied by the driver circuit can be reduced. Moreover, the antifuse-type ROM shown in FIG. 4 can reduce electric power for reading data, so that power consumption of the memory can be reduced and low power consumption of a whole wireless chip can be achieved.

Figure 5:
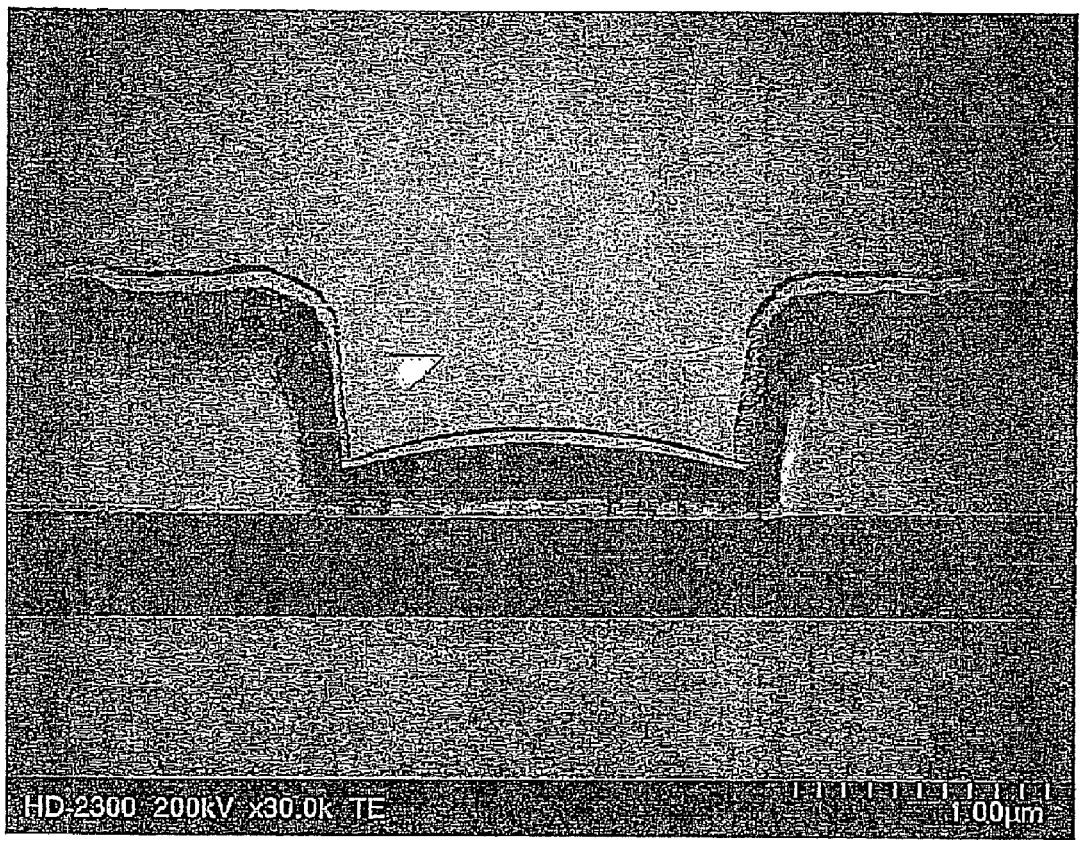
FIG. 5 is a cross-sectional photograph of antifuse-type ROM.

FIG. 5 shows a cross-sectional photograph of a state after formation of antifuse-type ROM over a glass substrate and application of voltage to obtain a short-circuit state (a conductive state between upper and lower electrodes). An amorphous silicon film with a thickness of 50 nm which is formed by a plasma CVD method was used as the silicon film of the antifuse-type ROM whose a photograph was taken. FIG. 5 shows a silicide reaction over an entire region where the silicon film and the first electrode are in contact with each other. Note that a silicide reaction does not have to be generated over an entire region of the antifuse-type ROM where the silicon film and the first electrode are in contact with each other, but it is acceptable as long as part of the region is conductive by the silicide reaction. The inventor has confirmed several memory elements which are conductive in part of the region where the silicon film and the first electrode are in contact with each other.

Figure 6A:
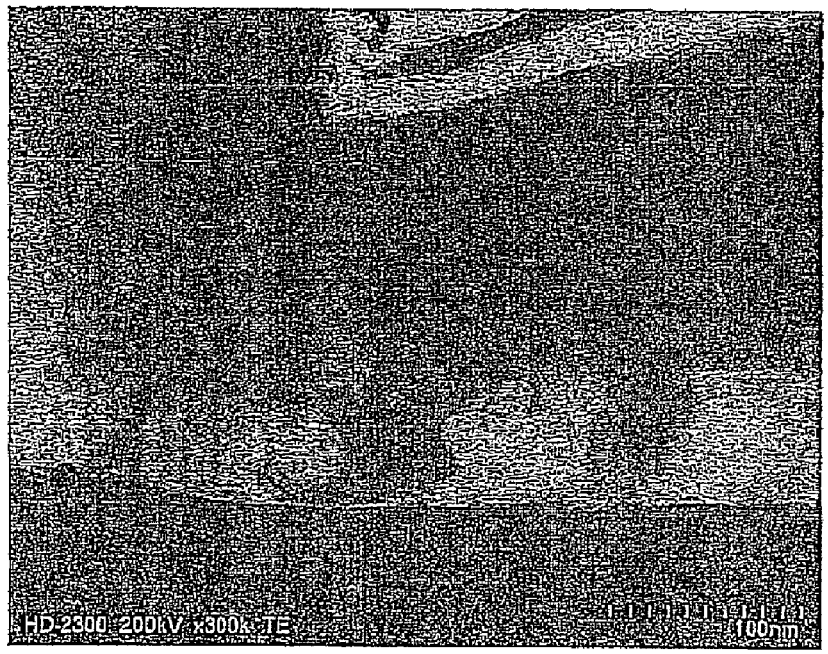
FIGS. 6A and 6B are a closeup cross-sectional photograph of antifuse-type ROM and a pattern diagram thereof, respectively.
Figure 6B:
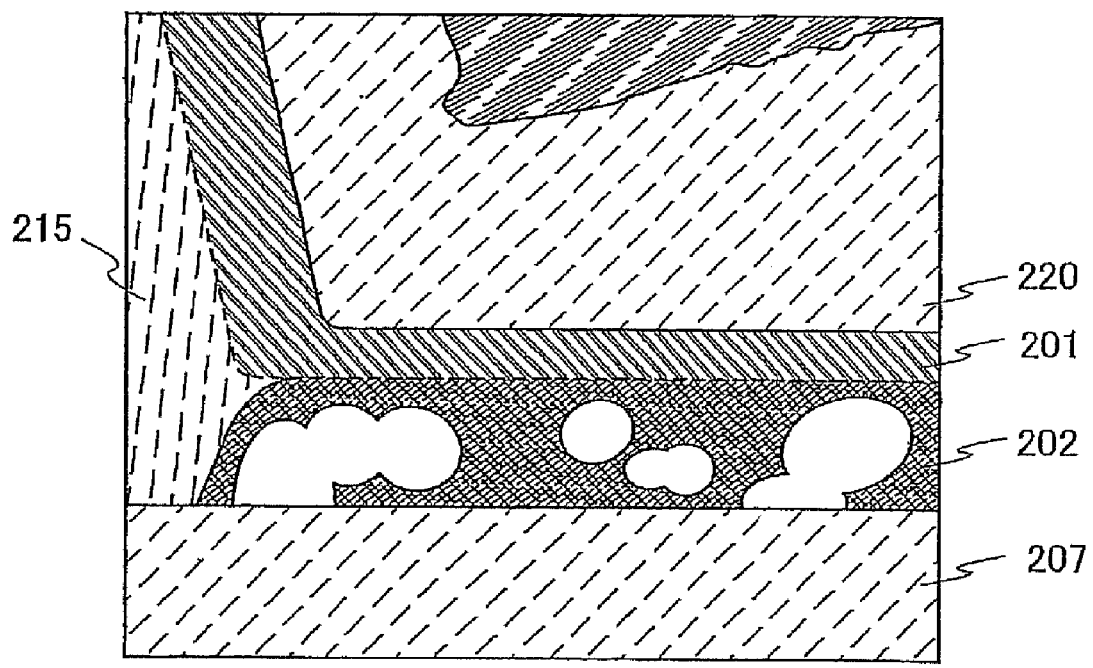

FIG. 6A shows enlarged view of the left side in the cross-sectional photograph of FIG. 5. FIG. 6B shows a schematic view thereof. According to an examination of a composition of each portion of a cross-sectional structure of FIG. 6B by EDX measurement, large amount of tungsten, silicon, and titanium were detected in a first electrode 207, a silicon film 215, and a second electrode 220, respectively. In addition, a silicide reaction is generated from both the first electrode 207 and the second electrode 220. A titanium silicide layer 201 is formed over an entire surface of a region of the silicon film 215 which is in contact with the second electrode 220. A region 202 which is in contact with the first electrode 207 is a region in which titanium silicide and tungsten silicide are mixed. The titanium silicide or the tungsten silicide contained in the region 202 is partially electrically connected to the titanium silicide layer 201, so that a short-circuit state (conductive state) is generated.

Then, an insulating film 122 which covers the source electrodes 116 and 118, the drain electrode 117, the second electrode 120, the third electrode 119, and the connection electrode 121 is formed. This insulating film 122 may be an inorganic insulating film or a stacked layer of an inorganic insulating film and an organic insulating film.

Next, a resist mask is formed and the insulating film 122 is selectively etched, so that an opening reaching the third electrode 119 and an opening reaching the connection electrode 121 are formed. Note that in order to ensure electrical connection with an antenna to be formed later, a size of the opening reaching the connection electrode 121 is made comparatively large or a plurality of openings are provided.

Then, the resist mask is removed, and a metal layer 124 for improving adhesion of the antenna and a fourth electrode 123 are formed. The metal layer 124 and the fourth electrode 123 are formed using a titanium film, a copper film, an aluminum film, or the like through the same step. The metal layer 124 and the fourth electrode 123 are formed by a sputtering method or an ink jetting method. In the case of employing a sputtering method, after the metal layer is formed, a resist mask is formed, selective etching is performed, and the resist mask is removed.

Next, an antenna 125 is formed by a sputtering method or a printing method. In the case of forming the antenna 125 by a screen printing method or an ink jetting method, a conductive paste in which conductive particles with a grain diameter of several nm to several tens μm are dissolved or dispersed in an organic resin is selectively printed, and then, baking for reducing electric resistance is performed.

As the conductive particles, metal particles of one or more kinds from silver (Ag), gold (Au), copper (Cu), nickel (Ni), platinum (Pt), palladium (Pd), tantalum (Ta), molybdenum (Mo), titanium (Ti), and the like, fine particles of silver halide, or dispersive nanoparticles can be used. In addition, as the organic resin contained in the conductive paste, one or more of organic resins which are selected from organic resins which function as a binder, a solvent, a dispersive agent, and a coating member for the metal particles can be used. Typically, an organic resin such as an epoxy resin or a silicone resin can be used. Further, when the conductive film is formed, baking may be preferably performed after the conductive paste is applied. For example, in the case where fine particles containing silver as its main component (e.g., a grain size of greater than or equal to 1 nm and less than or equal to 100 nm) is used for a material of the conductive paste, a conductive film can be obtained by baking of the paste at temperatures of 150 to 300° C. so as to be cured. Alternatively, fine particles containing solder or lead-free solder as its main component may be used. In that case, fine particles having a grain size of less than or equal to 20 μm are preferably used. Solder and lead-free solder have an advantage of being low cost.

In the case of forming the antenna 125 by a screen printing method, it is effective to provide the metal layer 124 as a base film when adhesion of the antenna 125 with the insulating film 122 is low. The antifuse-type ROM, the driver circuit, and the antenna are formed over the same substrate, so that a mounting step can be eliminated. Mounting here means a work of electrically connecting a substrate provided with the antenna to the driver circuit by a solder, thermocompression bonding, wire bonding, bump bonding, or the like. For example, mounting is performed when a silicon chip is attached to the antenna provided for the substrate.

There is no particular limitation on a shape of the antenna 125. As a transmission method of a signal applied to the antenna, an electromagnetic coupling method, an electromagnetic induction method, a microwave method, or the like can be employed. The transmission method may be appropriately selected by a practitioner in consideration of applications, and an antenna having an optimal length and shape may be provided in accordance with the transmission method.

For example, in the case of employing an electromagnetic coupling method or an electromagnetic induction method (e.g., 13.56 MHz band) as the transmission method, electromagnetic induction by change of the electric field density is utilized; therefore, a conductive film functioning as an antenna is formed into a circular shape (such as a loop antenna) or a spiral shape (e.g., a spiral antenna).

In the case of employing a microwave method (e.g., a UHF band (860 to 960 MHz band), a 2.45 GHz band, or the like) as the transmission method, a length or a shape of the conductive film functioning as an antenna may be appropriately set in consideration of a wavelength of an electric wave used for signal transmission. The conductive film functioning as an antenna can be formed in, for example, a linear shape (e.g., a dipole antenna), a flat shape (e.g., a patch antenna), and the like. The shape of the conductive film functioning as an antenna is not limited to a linear shape, and the conductive film functioning as an antenna may be formed in a curved-line shape, a meander shape, or a combination thereof, in consideration of the wavelength of the electromagnetic wave.

Figure 7A:
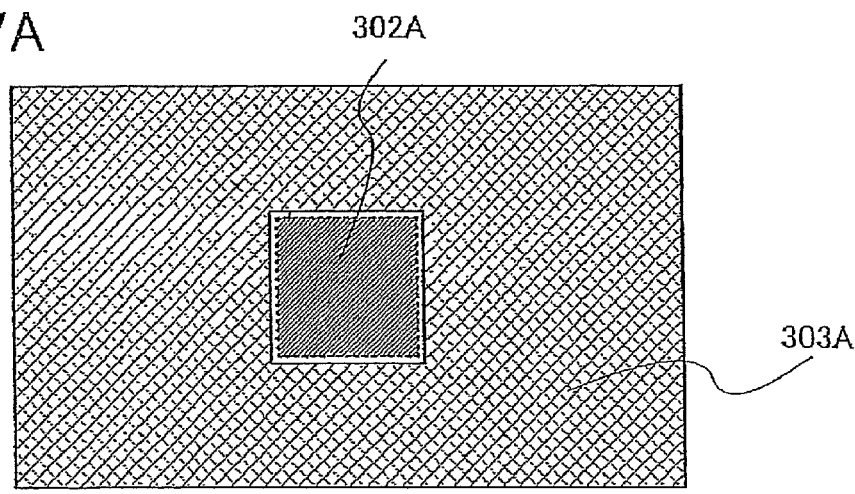
FIGS. 7A to 7E are top views illustrating an antenna.
Figure 7B:
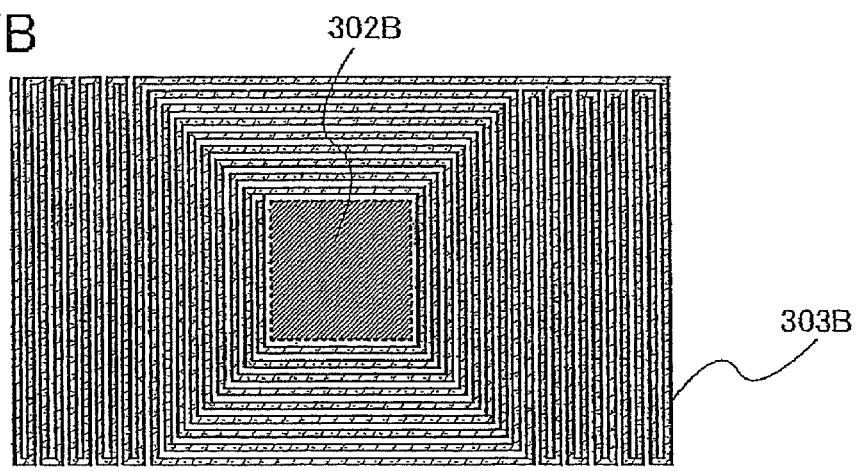
Figure 7C:
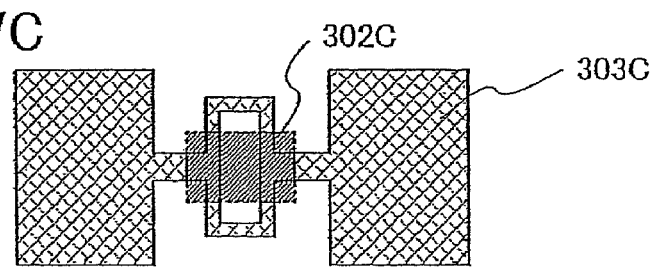
Figure 7D:
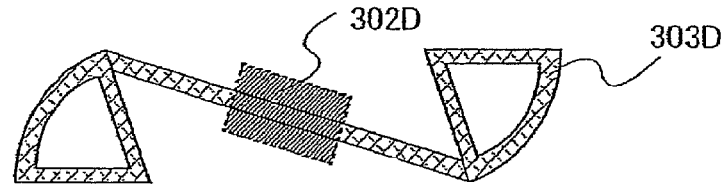
Figure 7E:
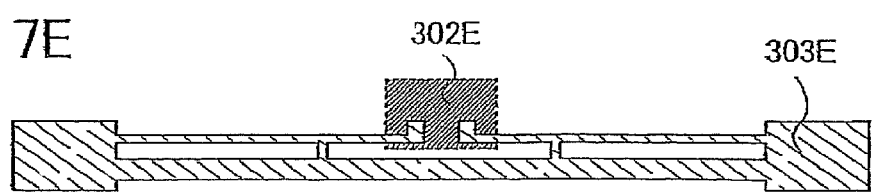

FIGS. 7A to 7E show examples of shapes of the antenna. For example, as shown in FIG. 7A, an antenna 303A may be provided all around a memory portion and driver circuit 302A. As shown in FIG. 7B, a thin antenna 303B may be provided around a memory portion and driver circuit 302B so as to circle around the memory portion and driver circuit 302B. As shown in FIG. 7C, the antenna may have a shape like an antenna 303C for receiving a high-frequency electromagnetic wave with respect to a memory portion and driver circuit 302C. As shown in FIG. 7D, the antenna may have a shape like an antenna 303D which is 180° omnidirectional (capable of receiving signals in any direction) with respect to a memory portion and driver circuit 302D. As shown in FIG. 7E, the antenna may have a shape like an antenna 303E which is extended to be long like a stick with respect to a memory portion and driver circuit 302E. The antenna 125 may be used in combination with the antennas with these shapes.

A length needed for the antenna is different depending on frequency used for reception. For example, in the case where the frequency is 2.45 GHz, if a half-wave dipole antenna is provided, the antenna may have a length of about 60 mm (½ wavelength), and if a monopole antenna is provided, the antenna may have a length of about 30 mm (¼ wavelength).

Next, peeling is performed at an interface of the peeling layer 102 or inside the layer, and an element is sealed with a first sheet 100a and a second sheet 100b. There is no particular limitation on a peeling method. A known peeling method such as a peeling method utilizing a surface oxide film of a tungsten film of a peeling layer (the technique described in Japanese Published Patent Application No. 2004-214281), a peeling method in which a peeling layer is etched, or a peeling method utilizing laser ablation may be used. In addition, sealing may be performed by bonding with the use of a bonding layer such as an epoxy resin. Moreover, the order of a peeling step and an antenna formation step may be switched; the antenna may be formed by a screen printing method after peeling.

A plastic film or paper is used for the first sheet 100a and the second sheet 100b. Alternatively, thin ceramic may be used for the first sheet 100a and the second sheet 100b in order to increase withstand voltage, or a sheet in which a fabric formed of carbon fiber or glass fiber is impregnated with a resin, a so-called prepreg may be used. If a flexible material is used as a material of the first sheet 100a and the second sheet 100b, a wireless chip which is suitable for being attached to a curved surface of an article can be provided.

Through the above-described steps, the antifuse-type ROM and the driver circuit are formed over the same substrate. Furthermore, the antifuse-type ROM and the driver circuit can be formed over the same substrate through a small number of steps.

The present invention including the above-described structure will be explained further in detail in the following Embodiments.

Embodiment 1

In this embodiment, a manufacturing method of a wireless chip including active matrix antifuse-type ROM will be explained below with reference to FIGS. 8A to 8D and FIGS. 9A to 9C.

First, a metal layer 502 which serves as a peeling layer is foamed over a substrate 501. A glass substrate is used as the substrate 501. A tungsten film, a tungsten nitride film, or a molybdenum film with a thickness of 30 to 200 nm which is obtained by a sputtering method is used for the metal layer 502.

Next, a surface of the metal layer 502 is oxidized to form a metal oxide layer (not shown). The metal oxide layer may be formed by oxidation of the surface with pure water or ozone water or oxidation with oxygen plasma. Alternatively, the metal oxide layer may be formed by heating in an atmosphere containing oxygen. Further alternatively, the metal oxide layer may be formed in a later step of forming an insulating film. In this case, when a silicon oxide film or a silicon oxynitride film is formed as the insulating film by a plasma CVD method, the surface of the metal layer 502 is oxidized, so that the metal oxide layer is formed.

Next, a first insulating film 503 is formed over the metal oxide layer. An insulating film such as a silicon oxide film, a silicon nitride film, or a silicon oxynitride film ($SiO_xN_y$) is used as the first insulating film 503. As a typical example, the first insulating film 503 is formed of a two-layer structure, and a structure is employed in which a silicon nitride oxide film with a thickness of 50 to 100 nm formed by a PCVD method using $SiH_4$, $NH_3$, and $N_2O$ as reactive gases and a silicon oxynitride film with a thickness of 100 to 150 nm using $SiH_4$ and $N_2O$ as reactive gases are stacked. Alternatively, as one layer of the first insulating film 503, a silicon nitride film (SiN film) with a thickness of less than or equal to 10 nm or a silicon oxynitride film ($SiN_xO_y$ film (X>Y)) with a thickness of less than or equal 10 nm is preferably used. Alternatively, a three-layer structure may be employed in which a silicon nitride oxide film, a silicon oxynitride film, and a silicon nitride film are sequentially stacked. Although the example in which the first insulating film 503 is formed as a base insulating film is described here, the first insulating film 503 is not necessarily provided if it is not needed.

Next, a semiconductor layer is formed over the first insulating film 503. The semiconductor layer is formed as follows: a semiconductor film having an amorphous structure is formed by a known method (a sputtering method, an LPCVD method, a plasma CVD method, or the like), and then crystallized by known crystallization treatment (laser crystallization, thermal crystallization, thermal crystallization using a catalyst such as nickel, or the like) to obtain a crystalline semiconductor film, and the crystalline semiconductor film is patterned into a desired shape after a resist mask is formed using a first photomask. Note that if a plasma CVD method is used, the first insulating film and the semiconductor film having an amorphous structure can be consecutively stacked without being exposed to the air. This semiconductor film is formed to have a thickness of 25 to 80 nm (preferably 30 to 70 nm). Although there is no limitation on a material of the amorphous semiconductor film, silicon or a silicon germanium (SiGe) alloy is preferably used for forming the amorphous semiconductor film.

Alternatively, for crystallization treatment of the semiconductor film having an amorphous structure, a continuous wave laser may be used. In order to obtain a crystal with a large grain size in crystallization of the amorphous semiconductor film, second to fourth harmonics of the fundamental wave is preferably employed using a solid laser capable of continuous wave oscillation. Typically, the second harmonic (532 nm) or the third harmonic (355 nm) of an Nd:$YVO_4$ laser (fundamental wave of 1064 nm) may be employed. When a continuous wave laser is used, laser light emitted from a continuous wave $YVO_4$ laser whose output power is 10 W is converted into a harmonic by a non-linear optical element. In addition, there is a method by which $YVO_4$ crystal and a non-linear optical element are put in an oscillator and a high harmonic wave is emitted. Then, the laser light is preferably shaped into a rectangular or elliptical shape on an irradiation surface by an optical system and is emitted to the semiconductor film. At this time, energy density of about 0.01 to 100 $MW/cm^2$ (preferably, 0.1 to 10 $MW/cm^2$) is needed. Then, the semiconductor film may be moved at a speed of about 10 to 2000 cm/s relatively to the laser light so as to be irradiated.

Next, the resist mask is removed. Then, if necessary, the semiconductor layer is doped with a small amount of impurity elements (boron or phosphorus) in order to control a threshold of a TFT. Here, an ion doping method is employed in which diborane ($B_2H_6$) is not separated by mass but excited by plasma.

Next, a surface of the semiconductor layer is washed at the same time as removal of an oxide film on the surface of the semiconductor layer with an etchant containing hydrofluoric acid.

Then, a second insulating film which covers the semiconductor layer is formed. The second insulating film is formed to have a thickness of 1 to 200 nm by a plasma CVD method or a sputtering method. The second insulating film is preferably formed to be as thin as 10 to 50 nm to have a single layer or stacked layer structure of an insulating film containing silicon, and then surface nitridation treatment using plasma with a microwave is performed. The second insulating film functions as a gate insulating film of a TFT to be formed later.

Next, gate electrodes 504 to 508 and a first electrode 509 which serves as a lower electrode of the antifuse-type ROM are formed over the second insulating film. A resist mask is formed using a second photomask, and then a conductive film with a thickness of 100 to 500 nm which is obtained by a sputtering method is patterned into a desired shape, so that the gate electrodes 504 to 508 and the first electrode 509 are formed.

A material of the gate electrodes 504 to 508 and the first electrode 509 is acceptable as long as the material reacts with silicon to form a silicide. The gate electrodes 504 to 508 and the first electrode 509 may be formed of a single layer of an element selected from titanium, tungsten, nickel, chromium, molybdenum, tantalum, cobalt, zirconium, vanadium, palladium, hafnium, platinum, and iron, or an alloy material or a compound material containing the element as its main component, or a stacked layer thereof. Note that a high melting point metal is preferably used for the gate electrode of the TFT; thus, tungsten or molybdenum is used. In the case where the gate electrodes 504 to 508 and the first electrode 509 are formed of a stacked layer, if a material layer which serves as an upper layer is formed of the above-described material, a material layer which serves as a lower layer may be a polycrystalline silicon layer doped with an impurity element such as phosphorus.

Next, a resist mask is formed using a third photomask so as to cover the semiconductor layers in regions to be p-channel TFTs, and an impurity element is introduced to the semiconductor layers in regions to be n-channel TFTs, using the gate electrodes 505 and 507 as masks, so that low concentration impurity regions are formed. As the impurity element, an impurity element imparting n-type conductivity or an impurity element imparting p-type conductivity can be used. As the impurity element imparting n-type conductivity, phosphorus, arsenic, or the like can be used. Here, phosphorus is introduced to the semiconductor layer in the regions to be the n-channel TFTs so as to be contained at concentrations of $1\times10^{15}$ to $1\times10^{19}$/cm$^3$, so that n-type impurity regions are formed.

Next, the resist mask is removed. A resist mask is formed using a fourth photomask so as to cover the semiconductor layers in the regions to be the n-channel TFTs, and an impurity element is introduced to the semiconductor layers in the regions to be the p-channel TFTs, using the gate electrodes 504, 506, and 508 as masks, so that p-type impurity regions are formed. As the impurity element imparting p-type conductivity, boron, aluminum, gallium, or the like can be used. Here, boron is introduced to the semiconductor layer in the regions to be the p-channel so as to be contained at concentrations of $1\times10^{19}$ to $1\times10^{20}$/cm$^3$, so that the p-type impurity regions can be formed. Consequently, source or drain regions 514 and 515 and a channel formation region 516 are formed in the semiconductor layer in the region to be the p-channel TFT.

Next, sidewalls 510 and 511 are formed on both side surfaces of the gate electrodes 504 to 508 and the first electrode 509. A formation method of the sidewalls 510 is as follows. First, a film containing an inorganic material such as silicon, oxide of silicon, or nitride of silicon, or a film containing an organic material such as an organic resin is formed by a plasma CVD method, a sputtering method, or the like to have a single layer or a stacked layer so as to cover the second insulating film, the gate electrodes 504 to 508, and the first electrode 509; accordingly, a third insulating film is formed. Then, the third insulating film is selectively etched by anisotropic etching mainly in a perpendicular direction to form insulating films (the sidewalls 510) which are in contact with the side surfaces of the gate electrodes 504 to 508 and the first electrode 509. Note that part of the second insulating film is etched to be removed at the same time as the formation of the sidewalls 510. Part of the second insulating film is removed, so that a remaining gate insulating layer 512 is formed under each of the gate electrodes 504 to 508 and the sidewalls 510. In addition, part of the second insulating film is removed, so that a remaining insulating layer 513 is formed under the first electrode 509 and the sidewalls 511.

Next, a resist mask is formed using a fifth photomask so as to cover the semiconductor layers in regions to be the p-channel TFTs, and an impurity element is introduced to the semiconductor layers in the regions to be the n-channel TFTs, using the gate electrodes 505 and 507 and the sidewalls 510 as masks, so that high concentration impurity regions are formed. The resist mask is removed after the impurity element is introduced. Here, phosphorus (P) is introduced to the semiconductor layer in the regions to be the n-channel TFTs so as to be contained at concentrations of $1\times10^{19}$ to $1\times10^{20}$/cm$^3$, so that n-type high concentration impurity regions can be formed. Consequently, source or drain regions 517 and 518, LDD regions 519 and 520, and a channel formation region 521 are formed in the semiconductor layer in the region to be the n-channel TFT. The LDD regions 519 and 520 are formed below the sidewalls 510.

Although the structure is described in which the LDD regions are formed in the semiconductor layer included in the n-channel TFT and LDD regions are not formed in the semiconductor layer included in the p-channel TFT, the present invention is not limited thereto. The LDD regions may be formed in the semiconductor layers included in both the n-channel TFT and the p-channel TFT.

Next, a fourth insulating film 522 containing hydrogen is formed by a sputtering method, an LPCVD method, a plasma CVD method, or the like, and then activation treatment and hydrogenation treatment of the impurity element added to the semiconductor layer are performed. Heat treatment (at 300 to 550° C. for 1 to 12 hours) in a furnace or a rapid thermal annealing method (RTA method) using a lamp light source is used for the activation treatment and hydrogenation treatment of the impurity element. A silicon nitride oxide film (SiNO film) obtained by a PCVD method is used for the fourth insulating film 522 containing hydrogen. Here, a thickness of the fourth insulating film 522 containing hydrogen is 50 to 200 nm. Besides, in the case where the semiconductor film is crystallized using a metal element which promotes crystallization, typically nickel, gettering which reduces nickel in the channel formation region can also be performed at the same time as the activation. Note that the fourth insulating film 522 containing hydrogen is a first layer of an interlayer insulating film.

Next, a fifth insulating film 523 which serves as a second layer of the interlayer insulating film is formed by a sputtering method, an LPCVD method, a plasma CVD method, or the like. A single layer or a stacked layer of an insulating film such as a silicon oxide film, a silicon nitride film, or a silicon oxynitride film is used for the fifth insulating film 523. Here, a thickness of the fifth insulating film 523 is 300 to 800 nm.

Next, a resist mask is formed over the fifth insulating film 523, using a sixth photomask, and the fourth insulating film 522 and the fifth insulating film 523 are selectively etched, so that a first opening reaching the first electrode 509 is formed. The resist mask is removed after the etching. A diameter of the first opening is preferably about 1 to 6 μm. In this embodiment, the diameter of the first opening is 2 μm.

A cross-sectional view of a semiconductor device manufactured through the preceding steps corresponds to FIG. 8A.

Next, a silicon film is formed by a sputtering method, an LPCVD method, a plasma CVD method, or the like. Any one of an amorphous silicon film, a microcrystalline silicon film, and a polysilicon film is used as the silicon film, and a thickness of the silicon film is 10 to 200 nm. In this embodiment, an amorphous silicon film with a thickness of 100 nm is formed by a plasma CVD method. Then, a resist mask is formed over the amorphous silicon film, using a seventh photomask, and the amorphous silicon film is selectively etched, so that a silicon layer 524 which overlaps with the first opening is formed. The resist mask is removed after the etching.

A cross-sectional view of the semiconductor device manufactured through the preceding steps corresponds to FIG. 8B.

Next, a resist mask is formed using an eighth photomask, and the fourth insulating film 522 and the fifth insulating film 523 are selectively etched, so that an opening reaching the semiconductor layer, an opening reaching the gate electrode, and a second opening reaching the first electrode 509 are formed. The resist mask is removed after the etching.

A cross-sectional view of the semiconductor device manufactured through the preceding steps corresponds to FIG. 8C.

Next, an exposed surface of the semiconductor layer and an oxide film on an exposed surface of the first electrode 109 are removed with an etchant containing hydrofluoric acid, and at the same time, the exposed surface of the semiconductor layer and the exposed surface of the first electrode 109 are washed.

Next, a conductive film is formed by a sputtering method. This conductive film is formed of a single layer of an element selected from titanium, tungsten, nickel, chromium, molybdenum, tantalum, cobalt, zirconium, vanadium, palladium, hafnium, platinum, iron, aluminum, and copper, or an alloy material or a compound material containing the element as its main component, or a stacked layer thereof. Note that in the case where the conductive film is stacked, at least one layer which is in contact with the silicon layer 524 is formed using a material which reacts with silicon to form a silicide and is different from a material (tungsten in this embodiment) used for forming the first electrode 509 which serves as a lower electrode of a memory element. For example, a three-layer structure of a titanium film, an aluminum film containing a minute amount of silicon, and a titanium film or a three-layer structure of a titanium film, an aluminum alloy film containing nickel and carbon, and a titanium film is employed. In this embodiment, a three-layer structure of a titanium film with a thickness of 100 nm, a pure aluminum film with a thickness of 350 nm, and a titanium film with a thickness of 100 nm is employed.

Next, a resist mask is formed using a ninth photomask, and the conductive film is selectively etched, so that source or drain electrodes 525 to 534, gate lead wirings 535 to 539, a second electrode 540 and a third electrode 541 of the antifuse-type ROM, and a fourth electrode 542 of an antenna portion are formed. The second electrode 540 overlaps with the first opening to serves as an upper electrode of the memory element. In addition, the third electrode 541 overlaps with the second opening to be electrically connected to the first electrode 509. Note that although not shown here, the fourth electrode 542 is electrically connected to TFTs of an antenna portion and power supply portion. The resist mask is removed after the etching.

A cross-sectional view of the semiconductor device manufactured through the preceding steps corresponds to FIG. 8D. In this embodiment, TFTs of a logic circuit portion 601, TFTs and antifuse-type ROM 600 of the memory portion 602, and TFTs of the antenna portion and power supply portion 603 can be formed over the same substrate with the use of nine photomasks.

Next, a sixth insulating film 543 which covers the TFTs of the logic circuit portion 601, the TFTs and the antifuse-type ROM 600 of the memory portion 602, and the TFTs of the antenna portion and power supply portion 603. An insulating film containing silicon oxide or an organic resin film is used as the sixth insulating film 543. The insulating film containing silicon oxide is preferably used for improving reliability of a wireless chip. Alternatively, an organic resin film fainted by a coating method is preferably used because the sixth insulating film 543 desirably has a planarized surface in the case where an antenna to be formed later is formed by a screen printing method. The film used as the sixth insulating film 543 may be appropriately selected by practitioners. Moreover, in this embodiment, the example is described in which the antenna to be formed later overlaps with a driver circuit in the power supply portion 603, and thus, the sixth insulating film 543 functions as an interlayer insulating film which isolates the driver circuit from the antenna. In the case where the antenna has a circular shape (e.g., a loop antenna) or a spiral shape, one of both ends of the antenna is led by a wiring of a lower layer, thus, it is preferable to provide the sixth insulating film 543. Note that in the case where a microwave method is employed and the antenna has a linear shape (e.g., a dipole antenna), a flat shape (e.g., a patch antenna), or the like, the antenna to be formed later can be arranged so as not to overlap with the driver circuit, and the memory portion; thus, the sixth insulating film 543 need not to be provided.

Next, a resist mask is formed using a tenth photomask, and the sixth insulating film 543 is selectively etched, so that a third opening reaching the third electrode 541 and a fourth opening reaching the fourth electrode 542 are formed. The resist mask is removed after the etching.

A cross-sectional view of the semiconductor device manufactured through the preceding steps corresponds to FIG. 9A.

Next, a metal film is formed over the sixth insulating film 543. A single layer formed of an element selected from titanium, nickel, and gold or a stacked layer thereof is used as the metal film. Then, a resist mask is fainted using an eleventh photomask, and the metal film is selectively etched, so that a lead wiring 544 is formed in a lead wiring portion 604 of the first electrode 509 and a base film 545 of the antenna is formed. Note that, here, the lead wiring 544 and the base film 545 can be selectively formed by a sputtering method using a metal mask without using the resist mask, as well. When the base film 545 of the antenna is provided, a large contact area with the antenna can be secured. In addition, when the base film 545 of the antenna is provided, improvement in adhesion with the sixth insulating film 543 can be achieved. Needless to say, the base film 545 of the antenna is fainted of a conductive material, thereby functioning as part of the antenna. Moreover, the lead wiring 544 need not to be formed depending on a layout of a circuit design.

A cross-sectional view of the semiconductor device manufactured through the preceding steps corresponds to FIG. 9B.

Next, the antenna 546 is formed over the base film 545 of the antenna. The antenna 546 can be formed by a screen printing method, or the antenna 546 can be formed in such a manner that a metal film formed of aluminum, silver, or the like is formed by a sputtering method and then patterned using a photomask. If reduction in the number of photomasks is prioritized, the antenna 546 may be formed by a screen printing method. A screen printing method refers to a method in which an ink or a paste, which is provided on a screen plate formed in such a manner that a predetermined pattern is formed by a photosensitive resin on a base made of a metal mesh or a high polymer fiber mesh, is transferred to a work which is placed on the opposite side of the screen plate, with the use of a plastic, metal, or rubber blade which is called a squeegee. A screen printing method has a merit that pattern formation in a comparatively large area is realized at low cost.

A cross-sectional view of the semiconductor device manufactured through the preceding steps corresponds to FIG. 9C. In this embodiment, the TFTs of the logic circuit portion 601, the TFTs and the antifuse-type ROM 600 of the memory portion 602, and the TFTs and the antenna of the antenna portion and power supply portion 603 can be formed over the same substrate with the use of eleven photomasks.

In the case where the lead wiring 544 and the base film 545 of the antenna are selectively formed by a sputtering method using a metal mask, a wireless chip shown in FIG. 9C can be formed using ten photomasks. In the case where a microwave method is employed and an antenna has a linear shape, a flat shape, or the like, the formation of the sixth insulating film 543 and the base film 545 of the antenna can be omitted; thus, the wireless chip can be formed using nine photomasks. Furthermore, if a driver circuit is designed and manufactured using only a p-channel TFT in order to reduce the number of photomasks, two photomasks become unnecessary, and the wireless chip can be formed using seven photomasks in total.

In addition, although the example in which the resist mask is formed using the photomask is described in this embodiment, there is no particular limitation on the patterning technique. The resist mask may be formed in such a manner that a resist material is selectively formed by a droplet discharging method without using the photomask.

Next, the metal layer 502 and the substrate 501 are peeled to be removed. Peeling is generated inside a metal oxide film, at an interface between the first insulating film 503 and the metal oxide film, or an interface between the metal oxide film and the metal layer 502, so that the wireless chip can be peeled from the substrate 501 with relatively less force. When the metal layer 502 and the substrate 501 are removed, a fixed substrate to be bonded on the side where the antenna is provided may be used.

Next, one sheet over which countless wireless chips are formed is divided by a cutter, dicing, or the like so as to be divided into individual wireless chips. In addition, if a method in which each wireless chip is picked up to be peeled is employed, this dividing step is not needed.

Next, the wireless chip is fixed to a sheet-like substrate. For the sheet-like substrate, plastic, paper, a prepreg, a ceramic sheet, or the like can be used. The wireless chip may be fixed so as to be interposed between two sheet-like substrates, or the wireless chip may be fixed to one sheet-like substance with a bonding layer. For the bonding layer, various curable adhesives such as a photo curable adhesive such as a reactive curable adhesive, a thermosetting adhesive, or an ultraviolet cure adhesive; or an aerobic adhesive can be used. Alternatively, the wireless chip can be arranged in the middle of making paper, thereby being provided inside one piece of paper.

By the wireless chip manufactured through the above-described steps, write-once read-many memory to which data can be written anytime after manufacture of the wireless chip can be realized. For example, after a wireless chip fixed to a flexible sheet-like substrate is attached to an article with a curved surface, data can be written to antifuse-type ROM included in the wireless chip.

This embodiment can be freely combined with Embodiment Mode.

Embodiment 2

In this embodiment, an example in which a process is partly different from that of Embodiment 1 will be shown in FIGS. 10A to 10D and FIGS. 11A to 11C. Note that portions which are common to those in Embodiment 1 are denoted by the same reference numerals, and the same explanation is omitted for simplification.

First, the same cross-sectional structure as FIG. 8A is obtained according to Embodiment 1. Note that FIG. 10A is the same as FIG. 8A.

Next, a silicon film is formed by a sputtering method, an LPCVD method, a plasma CVD method, or the like, and a metal film is stacked thereover by a sputtering method or a plasma CVD method. Any one of an amorphous silicon film, a microcrystalline silicon film, and a polysilicon film is used as the silicon film. A thickness of the silicon film is 10 to 200 nm. The metal film is formed using a simple substance such as titanium, tungsten, nickel, chromium, molybdenum, tantalum, cobalt, zirconium, vanadium, palladium, hafnium, platinum, or iron, or an alloy or a compound thereof to have a thickness of 10 to 100 nm. Note that the metal film is formed using a material which differs from a material used for forming a first electrode 509 which serves as a lower electrode of a memory element. In this embodiment, an amorphous silicon film with a thickness of 50 nm and a titanium nitride film with a thickness of 100 nm are consecutively stacked by a sputtering method without being exposed to the air. That is, in this embodiment, the silicon layer and the first electrode are not consecutively stacked, whereas the silicon layer and a second electrode are consecutively stacked. In this manner, forming an interface between a silicon layer 524 and the second electrode without exposure to the air is important for writing as memory and forming a silicide. In addition, the metal film may be a stacked layer, for example, a stacked layer of a titanium film and a titanium nitride film. Although the step of exposing the silicon layer 524 is described in Embodiment 1, the silicon layer 524 is protected by the consecutive formation of the metal film. In particular, in the case where the silicon layer 524 has a thickness of less than or equal to 50 nm, reduction in thickness of the silicon layer 524 due to washing with hydrofluoric acid or the like which is performed later can be prevented.

Next, a resist mask is formed over the metal film, using a seventh photomask, and the metal film and the amorphous silicon film are selectively etched, so that the silicon layer 524 and a second electrode 701 which overlap with a first opening are formed. The resist mask is removed after the etching. Note that in the case where the metal film is selectively removed by dry etching to form the second electrode 701, the titanium nitride film which is an upper layer of the second electrode 701 can prevent plasma damage to the silicon layer 524 during dry etching.

A cross-sectional view of the semiconductor device manufactured through the preceding steps corresponds to FIG. 10B.

Next, a resist mask is formed using an eighth photomask, and a fourth insulating film 522 and a fifth insulating film 523 are selectively etched, so that an opening reaching a semiconductor layer, an opening reaching a gate electrode, and a second opening reaching the first electrode 509 are formed. Then, the resist mask is removed after the etching.

A cross-sectional view of the semiconductor device manufactured through the preceding steps corresponds to FIG. 10C.

Next, an exposed surface of a semiconductor layer and an exposed oxide film on a surface of the first electrode are removed with an etchant containing hydrofluoric acid, and at the same time, the exposed surface of the semiconductor layer and the exposed surface of the first electrode are washed. Note that an upper surface of the silicon layer 524 is covered with the second electrode 701. In this embodiment, the second electrode 701 is a stacked layer of a titanium film and a titanium nitride film. The titanium film reacts with silicon to form a silicide more easily than the titanium nitride film. In addition, the titanium nitride film can prevent the titanium film from being etched with the etchant containing hydrofluoric acid when the exposed surface of the semiconductor layer and the exposed surface of the first electrode are washed.

Next, a conductive film is formed by a sputtering method. This conductive film is formed of a single layer of an element selected from titanium, tungsten, molybdenum, aluminum, and copper, or an alloy material or a compound material containing the element as its main component, or a stacked layer thereof. In this embodiment, a three-layer stacked structure of a titanium film with a thickness of 100 nm, an aluminum film containing a minute amount of silicon with a thickness of 350 nm, and a titanium film with a thickness of 100 nm is used.

Next, a resist mask is formed using a ninth photomask and the conductive film is selectively etched, so that source or drain electrodes 525 to 534, gate lead wirings 535 to 539, a third electrode 541 and a fifth electrode 702 of antifuse-type ROM, and a fourth electrode 542 of an antenna portion are formed. The fifth electrode 702 overlaps with the second electrode 701 to reduce electric resistance of a wiring. In addition, the third electrode 541 overlaps with the second opening to be electrically connected to the first electrode 509. Note that although not shown here, the fourth electrode 542 is electrically connected to TFTs of an antenna portion and power supply portion. The resist mask is removed after the etching.

A cross-sectional view of the semiconductor device manufactured through the preceding steps corresponds to FIG. 10D. Also in this embodiment, TFTs of a logic circuit portion 601, TFTs and antifuse-type ROM 600 of a memory portion 602, and TFTs of an antenna portion and power supply portion 603 can be formed over the same substrate with the use of nine photomasks.

Next, a sixth insulating film 543 which covers the TFTs of the logic circuit portion 601, the TFTs and the antifuse-type ROM 600 of the memory portion 602, and the TFTs of the antenna portion and power supply portion 603 is formed. An insulating film containing silicon oxide or an organic resin film is used for the sixth insulating film 543. The insulating film containing silicon oxide is preferably used for improving reliability of a wireless chip. Alternatively, an organic resin film formed by a coating method is preferably used because the sixth insulating film 543 desirably has a planarized surface in the case where an antenna to be formed later is formed by a screen printing method. The film used as the sixth insulating film 543 may be appropriately selected by practitioners.

Next, a resist mask is formed using a tenth photomask, and the sixth insulating film 543 is selectively etched, so that a fourth opening reaching the fourth electrode 542 is formed. The resist mask is removed after the etching.

A cross-sectional view of the semiconductor device manufactured through the preceding steps corresponds to FIG. 11A.

Next, a base film 545 of the antenna is formed over the sixth insulating film 543 by a sputtering method using a metal mask or a droplet discharging method. The base film 545 of the antenna is formed of a single layer of an element selected from titanium, nickel, and gold, or a stacked layer thereof. Note that the base film 545 here may be formed in such a manner that a resist mask is formed using a photomask and a metal film is selectively etched.

A cross-sectional view of the semiconductor device manufactured through the preceding steps corresponds to FIG. 11B.

Next, the antenna 546 is formed over the base film 545. The antenna 546 can be formed by a screen printing method, or the antenna 546 can be formed in such a manner that a metal film is formed by a sputtering method and then patterned using a photomask. If reduction in the number of photomasks is prioritized, the antenna 546 may be formed by a screen printing method.

A cross-sectional view of the semiconductor device manufactured through the preceding steps corresponds to FIG. 11C. In this embodiment, the TFTs of the logic circuit portion 601, the TFTs and the antifuse-type ROM 600 of the memory portion 602, and the TFTs and the antenna of the antenna portion and power supply portion 603 can be formed over the same substrate with the use of ten photomasks.

In addition, if a driver circuit is designed and manufactured using only a p-channel TFT in order to reduce the number of photomasks, two photomasks become unnecessary, and the wireless chip can be formed using eight photomasks in total.

Moreover, the subsequent steps are carried out as in Embodiment 1, so that the wireless chip can be completed.

Furthermore, although the example in which the resist mask is formed using the photomask is described in this embodiment, there is no particular limitation on the patterning technique. The resist mask may be formed in such a manner that a resist material is selectively formed by a droplet discharging method without using the photomask.

This embodiment can be freely combined with Embodiment Mode or Embodiment 1.

Embodiment 3

Figure 12:
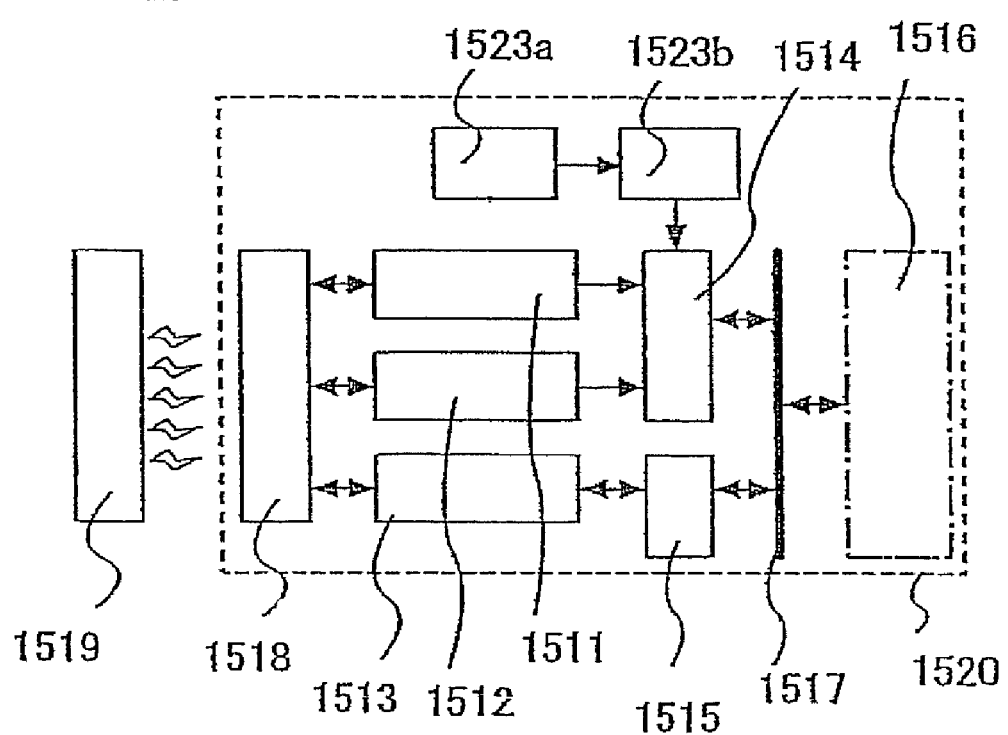
FIG. 12 is a block diagram.

A semiconductor device of this embodiment will be explained with reference to FIG. 12. As shown in FIG. 12, a semiconductor device 1520 of the present invention has a function of performing noncontact data communication. The semiconductor device 1520 includes a power supply circuit 1511, a clock generation circuit 1512, a data demodulation/modulation circuit 1513, a control circuit 1514 which controls other circuits, an interface circuit 1515, a memory circuit 1516, a data bus 1517, an antenna 1518, a sensor 1523a, and a sensor circuit 1523b. In FIG. 12, a driver circuit refers to the power supply circuit 1511, the clock generation circuit 1512, the data demodulation/modulation circuit 1513, the control circuit 1514 which controls other circuits, and the interface circuit 1515.

The power supply circuit 1511 generates various power supply voltage to be supplied to each circuit in the semiconductor device 1520, based on an AC signal inputted from the antenna 1518. The clock generation circuit 1512 generates various clock signals to be supplied to each circuit in the semiconductor device 1520, based on the AC signal inputted from the antenna 1518. The data demodulation/modulation circuit 1513 has a function of demodulating/modulating data communicated with a reader/writer 1519. The control circuit 1514 has a function of controlling the memory circuit 1516. The antenna 1518 has a function of transmitting/receiving electric waves. The reader/writer 1519 performs communication with the semiconductor device, control of the communication, and control of processing of the communicated data. Note that the structure of the semiconductor device is not limited to the above-described structure. For example, the semiconductor device may have a structure to which other components such as a limiter circuit of power supply voltage or hardware only for processing codes are added.

The memory circuit 1516 includes a memory portion as described in Embodiment Mode 1, that is, a plurality of memory elements in each of which a silicon film which generates a silicide reaction by external electrical action is interposed between a pair of conductive layers. Note that the memory circuit 1516 may include only the memory element in which the silicon film is interposed between the pair of conductive layers, or include a memory circuit with other structure. The memory circuit with other structure corresponds to, for example, one or a plurality of memory selected from DRAM, SRAM, FeRAM, mask ROM, PROM, EPROM, EEPROM, and flash memory.

The sensor 1523a includes semiconductor elements such as a resistance element, a capacitive coupling element, an inductive coupling element, a photovoltaic element, a photoelectric conversion element, a thermo-electromotive force element, a transistor, a thermistor, and a diode. The sensor circuit 1523b detects changes in impedance, reactance, inductance, voltage, or current, and performs analog/digital conversion (A/D conversion) to output a signal to the control circuit 1514.

This embodiment can be freely combined with Embodiment Mode, Embodiment 1, or Embodiment 2.

Embodiment 4

Figure 13A:
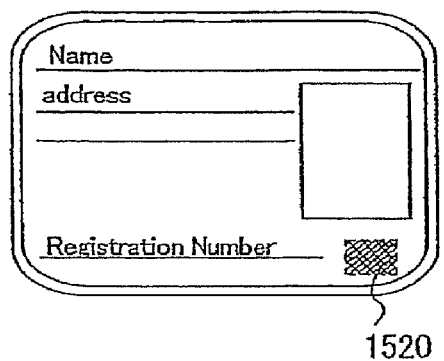
FIGS. 13A to 13F are diagrams illustrating examples of electronic appliances.
Figure 13B:
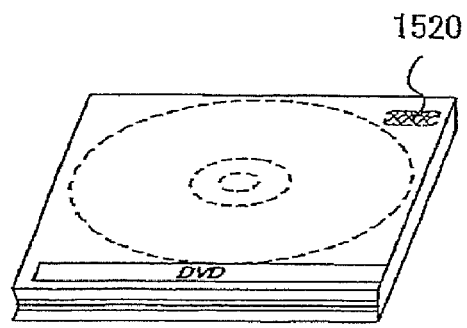
Figure 13C:
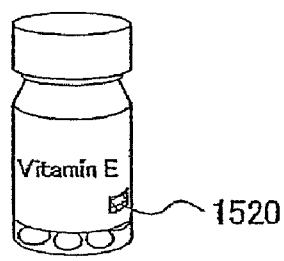
Figure 13D:
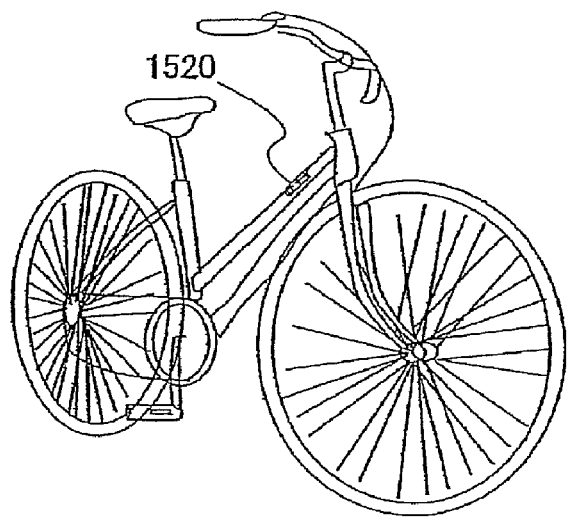
Figure 13E:
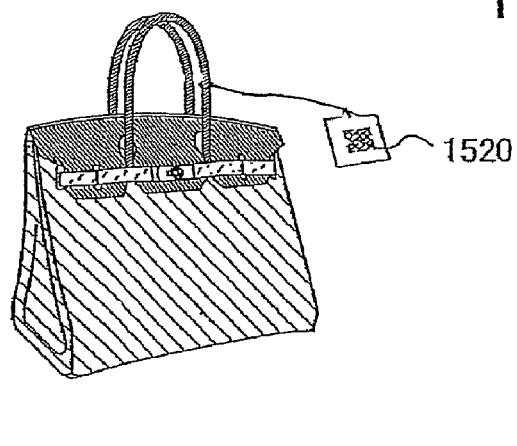
Figure 13F:
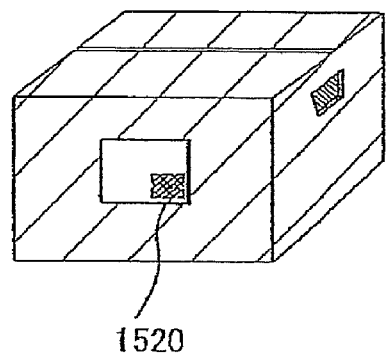

A semiconductor device functioning as a wireless chip can be formed according to the present invention. The wireless chip is applicable in a wide range. For example, the wireless chip can be applied to bills, coins, securities, bearer bonds, identification certificates (driver's licenses, certificates of residence, and the like, see FIG. 13A), recording media (DVD software, video tapes, and the like, see FIG. 13B), containers for package (package paper, bottles, and the like, see FIG. 13C), vehicles (bicycles and the like, see FIG. 13D), personal belongings (bags, glasses, and the like), foods, plants, animals, clothes, commodities, tags for packages or articles such as electronic appliances (see FIGS. 13E and 13F), and the like. The electronic appliances include a liquid crystal display device, an EL display device, a television device (also simply referred to as a TV, a TV receiving machine, or a television receiving machine), a cellular phone, and the like.

The semiconductor device 1520 of the present invention is fixed to a product by being attached to a surface of the product or embedded inside the product. For example, if the product is a book, the semiconductor device 1520 is fixed to the book by being embedded inside a paper, and if the product is a package made of an organic resin, the semiconductor device 1520 is fixed to the package by being embedded inside the organic resin. Since the semiconductor device 1520 of the present invention can be compact, thin, and lightweight, the design quality of the product itself is not degraded even after the device is fixed to the product. When the semiconductor device 1520 is provided to bills, coins, securities, bearer bonds, identification certificates, or the like, a certification function can be provided and the forgery can be prevented with the utilization of the certification function. Moreover, when the semiconductor device of the present invention is provided in containers for package, recording media, personal belongings, foods, clothes, commodities, electronic appliances, and the like, systems such as an inspection system can become more efficient.

Figure 14:
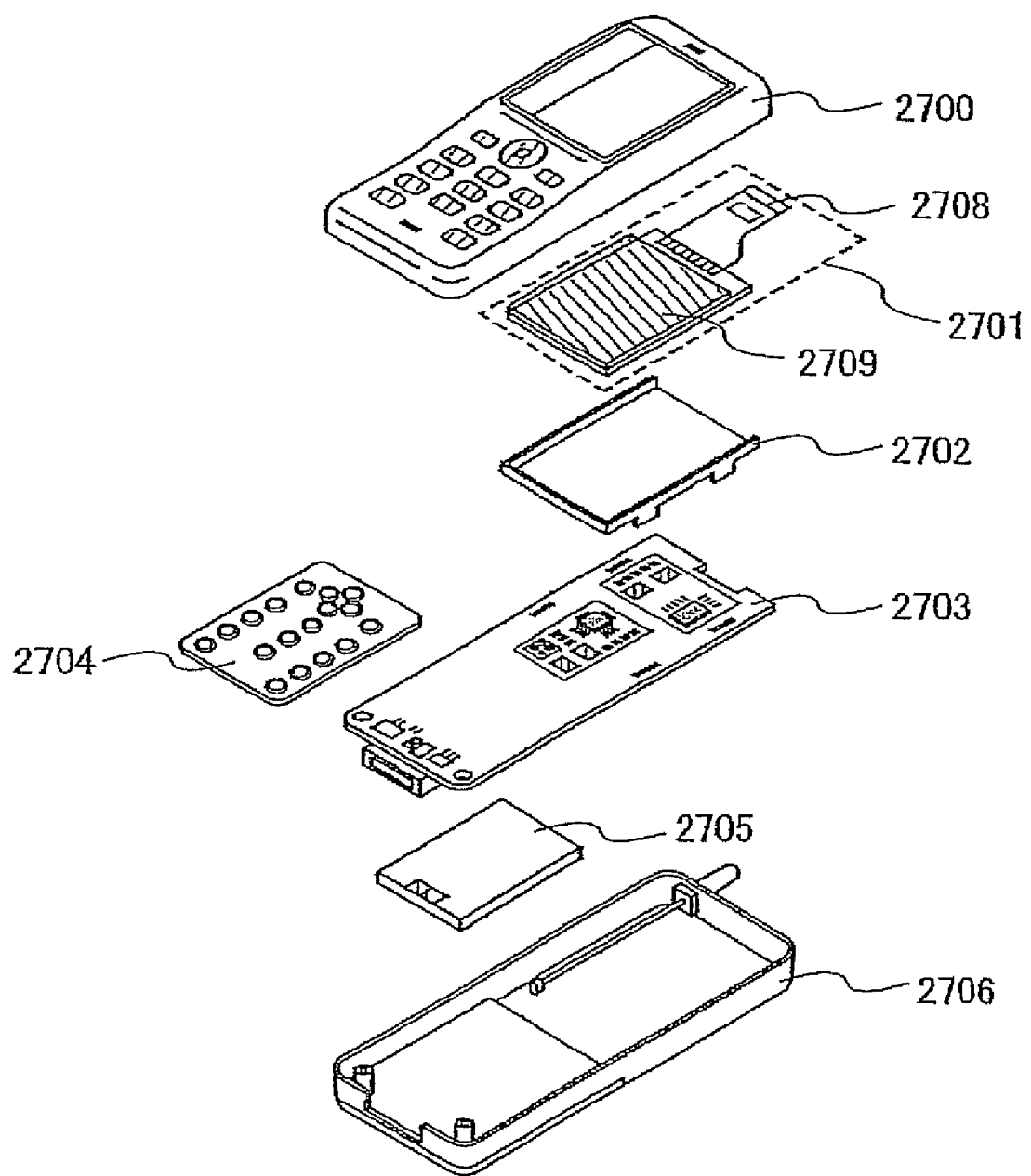
FIG. 14 is a diagram illustrating an example of an electronic appliance.
Figure 15:
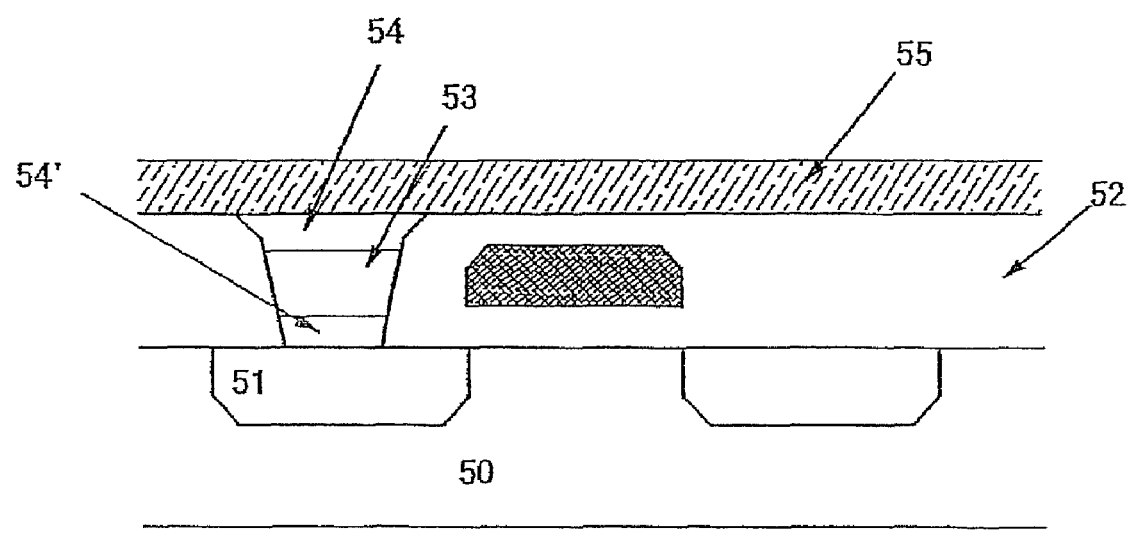
FIG. 15 is a diagram illustrating a conventional example.

Next, an aspect of an electronic appliance to which the semiconductor device of the present invention is mounted is explained with reference to the drawing. An electronic appliance shown here as an example is a cellular phone including chassis 2700 and 2706, a panel 2701, a housing 2702, a printed wiring board 2703, operation buttons 2704, and a battery 2705 (see FIG. 14). The panel 2701 is detachably incorporated into the housing 2702 and the housing 2702 is fitted into the printed wiring board 2703. The shape and size of the housing 2702 are appropriately modified in accordance with an electronic appliance to which the panel 2701 is incorporated. The printed wiring board 2703 has a plurality of packaged semiconductor devices mounted thereto. The semiconductor device of the present invention can be used as one of the packaged semiconductor devices. The plurality of semiconductor devices mounted to the printed wiring board 2703 have any function of a controller, a central processing unit (CPU), memory, a power supply circuit, an audio processing circuit, a transmitting/receiving circuit, and the like.

The panel 2701 is electrically connected to the printed wiring board 2703 through a connection film 2708. The panel 2701, the housing 2702, and the printed wiring board 2703 are placed inside the chassis 2700 and 2706 together with the operation buttons 2704 and the battery 2705. A pixel region 2709 in the panel 2701 is placed so as to be viewable from an opening window provided in the chassis 2700.

As described above, the semiconductor device of the present invention has advantages of its compactness, thinness, and lightness in weight. These advantages allow efficient usage of the limited space in the chassis 2700 and 2706 of the electronic appliance.

The semiconductor device of the present invention includes a memory element with a simple structure in which a silicon film which generates a suicide reaction by external electrical action is interposed between a pair of conductive layers; thus, an inexpensive electronic appliance using a semiconductor device can be provided. In addition, high integration is easily realized with the semiconductor device of the present invention; thus, an electronic appliance using a semiconductor device including a high-capacity memory circuit can be provided.

Moreover, a memory device included in the semiconductor device of the present invention, which writes data by external electrical action, has characteristics of being nonvolatile and capable of adding data. According to the above-described characteristics, forgery by rewriting can be prevented, and new data can be additionally written. Accordingly, an electronic appliance which uses a highly functional and highly value-added semiconductor device can be provided.

Note that the shapes of the chassis 2700 and 2706 are examples of an exterior shape of the cellular phone, and the electronic appliance of this embodiment can be changed into various modes in accordance with functions or applications thereof.

This embodiment can be freely combined with Embodiment Mode, Embodiment 1, Embodiment 2, or Embodiment 3.

INDUSTRIAL APPLICABILITY

Manufacture using a large area glass substrate makes it possible to provide a large number of wireless chips at a time and make unit cost of the wireless chip inexpensive. In addition, an antenna can be formed over the same substrate as the wireless chip; thus, a mounting step can be eliminated.

This application is based on Japanese Patent Application serial no. 2006-273394 filed in Japan Patent Office on Oct. 4, 2006, the entire contents of which are hereby incorporated by reference.

REFERENCE NUMERALS

100a: first sheet, 100b: second sheet, 101: substrate with insulating surface, 102: peeling layer, 103: insulating layer, 104: gate insulating film, 105: first gate electrode, 106: second gate electrode, 107: first electrode, 108: source region, 109: drain region, 110: drain region, 111: source region, 112: channel formation region, 113: channel formation region, 114: interlayer insulating film, 115: silicon film, 116: source electrode, 117: drain electrode, 118: source electrode, 119: third electrode, 120: second electrode, 121: connection electrode, 122: insulating film, 123: fourth electrode, 124: metal layer, 125: antenna, 302A: memory portion and driver circuit, 302B: memory portion and driver circuit, 302C: memory portion and driver circuit, 302D: memory portion and driver circuit, 302E: memory portion and driver circuit, 303A: antenna, 303B: antenna, 303C: antenna, 303D: antenna, 303E: antenna, 501: substrate, 502: metal layer, 503: first insulating film, 504 to 508: gate electrode, 509: first electrode, 510: sidewall, 511: sidewall, 512: gate insulating layer, 513: insulating layer, 514: source region or drain region, 515: source region or drain region, 516: channel formation region, 517: source region or drain region, 518: source region or drain region, 519: LDD region, 520: LDD region, 521: channel formation region, 522: fourth insulating film, 523: fifth insulating film, 524: silicon layer, 525 to 534: source electrode or drain electrode, 535 to 539: gate lead wiring, 540: second electrode, 541: third electrode, 542: fourth electrode, 543: sixth insulating film, 544: lead wiring, 545: base film of antenna, 546: antenna, 600: antifuse-type ROM, 601: logic circuit portion, 602: memory portion, 603: antenna portion and power supply portion, 604: lead wiring portion of first electrode, 701: second electrode, 702: fifth electrode, 1511: power supply circuit, 1512: clock generation circuit, 1513: data demodulation/modulation circuit, 1514: control circuit, 1515: interface circuit, 1516: memory circuit, 1517: data bus, 1518: antenna (antenna coil), 1519: reader/writer, 1520: semiconductor device, 1523a: sensor, 1523b: sensor circuit, 2700: chassis, 2701: panel, 2702: housing, 2703: printed wiring board, 2704: operation button, 2705: battery, 2706: chassis, 2708: connection film, and 2709: pixel region.

What is claimed is:

1. A semiconductor device comprising:
    a driver circuit over an insulating substrate, wherein the driver circuit includes a thin film transistor; and
    a memory element over the insulating substrate, wherein the memory element includes a first electrode, a silicon film over the first electrode, and a second electrode over the silicon film,
    wherein a gate electrode of the thin film transistor and the first electrode contain tungsten,
    wherein source and drain electrodes of the thin film transistor and the second electrode contain titanium,
    wherein the source and drain electrodes of the thin film transistor and a portion of the second electrode are in direct contact with a same interlayer insulating film.

2. A semiconductor device according to claim 1, wherein the insulating substrate is a glass, a plastic, a paper, a prepreg, or a ceramic sheet.

3. A semiconductor device according to claim 1, wherein the silicon film is an amorphous silicon film, a microcrystalline silicon film, or a polycrystalline silicon film.

4. A semiconductor device according to claim 1, wherein the second electrode is arranged so as to be at a right angle to the first electrode.

5. A semiconductor device according to claim 1, wherein the source and the drain electrodes of the thin film transistor and the second electrode contain aluminum over the titanium.

6. A semiconductor device comprising:
    a driver circuit over an insulating substrate, wherein the driver circuit includes a thin film transistor; and
    a memory element over the insulating substrate, wherein the memory element includes a first electrode, a silicon film over the first electrode, and a second electrode over the silicon film,
    wherein a gate electrode of the thin film transistor and the first electrode contain tungsten, and are formed over and in direct contact with a same surface, and
    wherein source and drain electrodes of the thin film transistor and the second electrode contain titanium.

7. A semiconductor device according to claim 6, wherein the insulating substrate is a glass, a plastic, a paper, a prepreg, or a ceramic sheet.

8. A semiconductor device according to claim 6, wherein the silicon film is an amorphous silicon film, a microcrystalline silicon film, or a polycrystalline silicon film.

9. A semiconductor device according to claim 6, wherein the second electrode is arranged so as to be at a right angle to the first electrode.

10. A semiconductor device according to claim 6, wherein the same surface is a surface of a gate insulating film.

11. A semiconductor device according to claim 6, wherein the source and the drain electrodes of the thin film transistor and the second electrode contain aluminum over the titanium.

12. A semiconductor device comprising:
    a driver circuit including a transistor; and
    a memory element including a first electrode, a silicon film over the first electrode, and a second electrode over the silicon film,
    wherein a gate electrode of the transistor and the first electrode contain tungsten,
    wherein source and drain electrodes of the transistor and the second electrode contain titanium, and
    wherein the source and drain electrodes of the transistor and a portion of the second electrode are in direct contact with a same interlayer insulating film.

13. A semiconductor device according to claim 12, wherein the driver circuit and the memory element are formed over a glass, a plastic, a paper, a prepreg, or a ceramic sheet.

14. A semiconductor device according to claim 12, wherein the silicon film is an amorphous silicon film, a microcrystalline silicon film, or a polycrystalline silicon film.

15. A semiconductor device according to claim 12, wherein the second electrode is arranged so as to be at a right angle to the first electrode.

16. A semiconductor device according to claim 12, wherein the source and the drain electrodes of the transistor and the second electrode contain aluminum over the titanium.

17. A semiconductor device comprising:
    a driver circuit including a transistor; and
    a memory element including a first electrode, a silicon film over the first electrode, and a second electrode over the silicon film,
    wherein a gate electrode of the transistor and the first electrode contain tungsten, and are formed over and in direct contact with a same surface, and
    wherein source and drain electrodes of the transistor and the second electrode contain titanium.

18. A semiconductor device according to claim 17, wherein the driver circuit and the memory element are formed over a glass, a plastic, a paper, a prepreg, or a ceramic sheet.

19. A semiconductor device according to claim 17, wherein the silicon film is an amorphous silicon film, a microcrystalline silicon film, or a polycrystalline silicon film.

20. A semiconductor device according to claim 17, wherein the second electrode is arranged so as to be at a right angle to the first electrode.

21. A semiconductor device according to claim 17, wherein the same surface is a surface of a gate insulating film.

22. A semiconductor device according to claim 17, wherein the source and the drain electrodes of the transistor and the second electrode contain aluminum over the titanium.

* * * * *